United States Patent [19]
Dangelo et al.

[11] Patent Number: 5,910,897
[45] Date of Patent: Jun. 8, 1999

[54] SPECIFICATION AND DESIGN OF COMPLEX DIGITAL SYSTEMS

[75] Inventors: Carlos Dangelo, Los Gatos; Vijay Nagasamy, Union City, both of Calif.

[73] Assignee: LSI Logic Corporation, Milpitas, Calif.

[21] Appl. No.: 08/890,174

[22] Filed: Jul. 9, 1997

Related U.S. Application Data

[63] Continuation of application No. 08/603,037, Feb. 16, 1996, abandoned, which is a continuation of application No. 08/252,231, Jun. 1, 1994, Pat. No. 5,493,508.

[51] Int. Cl.$^6$ ................................................. G06F 17/50
[52] U.S. Cl. .......................... 364/488; 364/489; 364/578
[58] Field of Search ................................. 364/488, 489, 364/490, 578

[56] References Cited

U.S. PATENT DOCUMENTS

| | | | |
|---|---|---|---|
| 4,833,619 | 5/1989 | Shimizu et al. | 364/489 |
| 5,146,583 | 9/1992 | Matsunaka et al. | 395/500 |
| 5,222,030 | 6/1993 | Dangelo et al. | 364/489 |
| 5,258,919 | 11/1993 | Yamanouchi et al. | 364/489 |
| 5,299,137 | 3/1994 | Kingsley | 364/489 |

*Primary Examiner*—Vincent N. Trans

[57] ABSTRACT

A methodology for generating structural descriptions of complex digital devices from high-level descriptions and specifications is disclosed. The methodology uses a systematic technique to map and enforce consistency of the semantics imbedded in the intent of the original, high-level descriptions. The design activity is essentially a series of transformations operating upon various levels of design representations. At each level the intended meaning (semantics) and formal software manipulations are captured to derive a more detailed level describing hardware meeting the design goals. Important features of the methodology are: capturing the users concepts, intent, specification, descriptions, constraints and trade-offs; architectural partitioning; what-if analysis at a-high level; sizing estimation; timing estimation; architectural trade-off; conceptual design with implementation estimation; and timing closure. The methodology includes using estimators, based on data gathered over a number of realized designs, for partitioning and evaluating a design prior to logic synthesis. From the structural description, a physical implementation of the device is readily realized. The methodology further includes an automated interactive, iterative technique for creating a system-level specification in a directly-executable formal specification language. This technique makes use of formal verification and feasibility analysis techniques to iteratively refine the specification prior to implementation. This iterative refinement eliminates many ambiguities and inconsistencies from the specification, and ensures that there is at least one realizable implementation of the specification. The formal verification techniques are further employed to ensure that as the design progresses, compliance with the specification is maintained, and that any specification change is reflected and accounted for, both system-wide and implementation-wide.

20 Claims, 15 Drawing Sheets

SPECIFICATION AND DESIGN OF COMPLEX DIGITAL SYSTEMS

This application is a continuation of U.S. patent application Ser. No. 08/603,037 filed Feb. 16, 1996, now abandoned, which is a continuation of U.S. patent application Ser. No. 08/252,231, filed Jun. 1, 1994, now U.S. Pat. No. 5,493,508.

TECHNICAL FIELD OF THE INVENTION

The present invention relates to computer-aided design tools and techniques for the design and implementation of complex circuits and systems, particularly digital devices.

BACKGROUND OF THE INVENTION

One of the most significant problems faced by designers of electronic systems, particularly digital systems, is meeting the demand for greater speed, complexity and functionality. At the same time, the digital system designer must ensure that the design will be as reliable as possible, and that it can be produced as quickly as possible. These pressures are fueled by recent advances in semiconductor technology which make possible the design of extremely fast integrated circuit (IC) chips having literally millions of transistors in relatively small packages. The added fact that these newer high-density integrated circuits often draw considerably less power than their less dense predecessors makes them all the more attractive to potential users (e.g., for high-functionality, portable, battery-operated devices such as notebook computers and other battery powered, portable equipment).

In producing large, high-complexity electronic systems which incorporate new integrated circuit designs, particularly semi-custom ASICs (Application Specific Integrated Circuits), there are essentially a number of separate designs occurring at a number of different levels of abstraction. For example, in a typical electronic system which incorporates one or more new ASIC designs, it is necessary to specify the design of the systems and to specify the design(s) of the ASIC(s). Many of the ASIC design choices are based upon and derived from higher-level design choices made in the specification of the system design.

It is well established and understood by those of ordinary skill in the art that as the complexity of an integrated circuit (e.g., ASIC) design increases, so does the difficulty of ensuring the "correctness" of the design. Modern simulation tools aid considerably in verifying the function of a digital integrated circuit, but verifying the behavior of a system design which includes one or more such integrated circuit designs is considerably more complicated.

Recent studies have shown that roughly 50% of all digital systems designed fail to function correctly the first time. By way of contrast, the first-time success rate for ASICs alone is considerably higher. With complicated electronic system designs, ASIC designers can often become engrossed in the lower-level ASIC design issues and can miss important system-related design issues. In effect, the designer is often unable to "see the forest for the trees". Conversely, when working on the system-level design, it is often difficult to anticipate the effect of system-level design choices on the lower levels of the design. As a result, perfectly functional ASIC designs may be produced which fail to perform properly when interconnected as an electronic system.

One of the main reasons for this relatively higher rate of system design failure is that today's design methodologies typically rely on "perfect" design specification which must completely and accurately specify the design of an electronic system. Often times the specification is written on paper in a natural (non-formal) language (i.e., written in an ad hoc fashion using plain language, e.g., English), and there are no tools to help the system designer ascertain the correctness or completeness of the specification until quite late in the implementation stage.

Further, the use of non-formal language for a system specification introduces the possibility of inconsistencies and ambiguities. The peculiarities of the specification writer's phrasing of the specification can lead to misinterpretation by others, ultimately resulting in unintended or unanticipated system behavior.

Often, it may become apparent during the design of one of the lower-level portions (subsystems) of an electronic system (e.g., an ASIC or a portion thereof) that system-level design choices have created unanticipated lower-level technical problems. As a result, a different lower-level approach is chosen, necessitating a change in the overall system design. It is often difficult to ensure that changes made in this manner will not affect the overall behavior of the system.

Even when a design seems to proceed smoothly, requiring no system-level changes, and where all subsystems perform "successfully" according to their respective lower-level specifications, unanticipated and unspecified peculiarities of the subsystems can interact in unexpected ways to cause improper system behavior. This is especially troublesome when the improper behavior occurs only under conditions which occur infrequently, since such conditions are often difficult to anticipate and/or to test.

Often, after a portion of the design and/or implementation of the system, it may be discovered that something was overlooked in the initial specification. If the oversight is discovered early enough in the design process, it may be possible to simply revise the specification. More often, however, it is necessary to iterate at least a portion of both the specification and the design process. Depending upon how late in the design process the problem is discovered, this can impose significant delays in time, and significant additional costs to the design process.

Many of the problems associated with producing large, complicated "first-time-right" circuits and systems arise from the automated design methodologies presently in use. These methodologies are quite good at eliminating repetitive and tedious manual operations, but often perform poorly with respect to higher-level design integrity.

Present day state-of-the-art design technique, logic synthesis, is really only a mapping between different levels of physical abstraction.

One of the most difficult problems in design automation is the inability to get timing closure at even the gate level effectively. This forces designers to do two designs: logic design and timing design. Otherwise, the designer simply over-designs the circuits, because the best case timing is much different from the worst case timing. In other cases, designers insist on control of device layout so that they can evaluate all of the tradeoffs between implementation and timing.

Present computer aided design (CAD) systems for the design of electronic circuits, referred to as ECAD or Electronic CAD systems, assist in the design of electronic circuits by providing a user with a set of software tools running on a digital computer with a graphical display device. Typically, five major software program functions run on the ECAD system: a schematic editor, a logic compiler, a logic simulator, a logic verifier, and a layout program. The schematic editor program allows the user of the system to enter and/or modify a schematic diagram using the display screen, generating a net list (summary of connections between components) in the process. The logic compiler takes the net list as an input, and using a component database puts all of the information necessary for layout, verification and simulation into a schematic object file or files whose format(s) is(are) optimized specifically for those functions. The logic verifier checks the schematic for design errors, such as multiple outputs connected together, overloaded signal paths, etc., and generates error indications if any such design problems exist. The logic simulator takes the schematic object file(s) and simulation models, and generates a set of simulation results, acting on instructions, initial conditions and input signal values provided to it either in the form of a file or user input. The layout program generates data from which a semiconductor chip (or a circuit board) may be laid out and produced.

The Modular Design Environment (MDE) produced by LSI Logic Corporation of Milpitas, Calif., is a suite of software tools for computers running the UNIX operating system. MDE comprises a schematic editor (LSED) and a simulator (LDS), among other software programs, and provides an example of commercially available tools of the aforementioned type. Another example of a schematic editor, schematic compiler, and schematic simulator may be found in the SCALDstation produced by Valid Logic Systems, Inc. of Mountain View, Calif.

VHDL, or VHSIC (Very High Speed Integrated Circuit) Hardware Description Language, is a recently developed, higher level language for describing complex devices. The form of a VHDL description is described by means of a context-free syntax together with context-dependent syntactic and semantic requirements expressed by narrative rules. VHDL is described in *IEEE Standard VHDL Language Reference Manual* (IEEE Std 1076–1987), and is also known as MIL-STD-454, Regulation 64.

VHDL represents an important step forward in design specification languages because the semantics, or intent, of the language constructs are clearly specified. In theory, VHDL unambiguously describes a designer's intended system or circuit behavior, in syntactic terms. The "design entity" is the primary hardware abstraction in VHDL. It represents a portion of a hardware design that has well-defined inputs and outputs and performs a well-defined function. A design entity may represent an entire system, a sub-system, a board, a chip, a macro-cell, a logic gate, or any level of abstraction in between. A "configuration" can be used to describe how design entities are put together to form a complete design.

VHDL supports three distinct styles for the description of hardware architectures. The first of these is "structural" description, wherein the architecture is expressed as a hierarchical arrangement of interconnected components. The second style is "data-flow" description, in which the architecture is broken down into a set of concurrent register assignments, each of which may be under the control of gating signals. This description subsumes the style of description embodied in register transfer level (RTL) descriptions. The third style is "behavioral" description, wherein the design is described in sequential program statements similar to a high-level programming language. In the main description hereinafter, the behavioral description style is discussed. However, all three styles may be intermixed in a single architecture.

A methodology for deriving a lower-level, physically-implementable description, such as a RTL description of the higher level (e.g., VHDL) description, via an intermediate rule-based tool such as Prolog, is disclosed herein.

Prolog is a programming language based on predicate logic. It can be used for "intelligent" tasks like mathematical theorem proving. A Prolog program is a set of rules which define the relationships among objects. The general form of a Prolog rule is a "horn" clause, in which a specified "goal" is true if certain conditions are true. Execution of a Prolog program involves finding a proof for the goal in question, using unification and resolution. An important aspect of Prolog employed in the present invention is "term__expansion", which converts predefined rules into ordinary Prolog clauses.

DISCLOSURE OF THE INVENTION

It is therefore an object of the present invention to provide a methodology for deriving a valid structural description of a circuit or system from a behavioral description thereof, thereby allowing a designer to work at higher levels of abstraction and with larger, more complex circuits and systems.

It is a further object of the present invention to provide a technique for automatically translating behavioral descriptions of a circuit or system into physical implementations thereof.

It is a further object of the invention to raise the level of design validation from a structural (net list) level to a behavioral level.

It is a further object of the invention to provide a more standardized design environment, thereby alleviating the need for cross-training between different design platforms and allowing resources to be directed more towards synthesis and testability.

It is a further object of the invention to provide an automated, interactive technique for specifying complex digital systems.

It is a further object of the present invention to provide a technique for iteratively refining a specification for a complex digital system.

It is a further object of the present invention to provide a technique for formal specification of complex digital systems in an executable format whereby the specification itself may be "executed" in an automated manner to produce an implementation thereof.

It is a further object of the present invention to provide an automated technique for verifying correctness of the design of multi-chip electronic systems.

It is a further object of the present invention to provide an automated technique for coordinating system and subsystem specifications with the design implementations thereof.

It is a further object of the present invention to provide a technique for ensuring that specification changes made at any level of an electronic system are reflected and accounted for in a system-wide fashion.

It is a further object of the present invention to provide an automated technique for specifying and designing complex digital systems which "converges" on a feasible implementation in an automated, interactive, iterative fashion.

It is a further object of the present invention to provide an automated environment for the specification and design of complex digital systems whereby a user thereof can query properties of a formal executable specification.

It is a further object of the present invention to provide an automated environment for the design of complex digital systems which assists the user thereof in understanding the properties of those systems and relationships between modules (or subsystems) of the system.

It is a further object of the present invention to provide an automated environment for the design of complex digital systems which assists the user thereof to ascertain the degree of completeness of a specification with respect to selected properties of the digital system.

It is a further object of the present invention to provide an automated environment for the design of complex digital systems which assists in determining whether the specification of a digital system is "correct" and valid with respect to intended properties of the system.

It is a further object of the present invention to provide an automated environment for the design of complex digital systems which provides feedback to the user thereof to help detect/locate/correct errors in system specifications before they propagate into implementations.

It is a further object of the present invention to provide an automated design technique which eliminates and/or assists in eliminating inconsistencies and ambiguities in complex digital system specifications.

According to the invention, there is provided an electronic CAD system operated with a suite of software tools for enabling a designer to create and validate a structural description and physical implementation of a circuit or system (hereinafter, "device") from a behavior-oriented description using a high-level computer language. The methodology includes the following steps:

First, the designer specifies the desired behavior of the device in a high-level language, such as VHDL. The description includes high-level timing goals.

Next, in a "behavioral simulation" step starting with the VHDL behavioral description of a design, the designer iterates through simulation and design changes until the desired behavior is obtained.

Next, in a "partitioning" step, the design is partitioned into a number of architectural blocks. This step is effectively one of exploring the "design space" of architectural choices which can implement the design behavior. Links to the physical design system enable high level timing closure by constraining the feasible architectural choices to those which meet the high-level timing and area (size) goals. This is a key step because it represents the bridge between the conceptual level and the physical level. A second function of this step is to direct the various architectural blocks to the appropriate synthesis programs.

Next, in a "logic synthesis" step, a number of separate programs are used to efficiently synthesize the different architectural blocks identified in the partitioning step. Those blocks having highly regular structures or well understood functions are directed to specific synthesis tools (e.g. memory or function compilers). Those blocks with random or unstructured logic are directed to more general logic synthesis programs. The output of this step is a net list of the design.

Next, in a "physical simulation" step, the gate-level design description is simulated, comparing the results with those from the initial behavioral simulation. This provides a check that the circuit implementation behaves as intended, and that the timing goals are achieved.

Optionally, the design is back-annotated to ensure that other physical design limitations, such as capacitive loads and parasitics, are not exceeded.

Finally the design is input to existing software systems which control the physical implementation of the design, such as in an ASIC (Application Specific Integrated Circuit) device.

An important feature of the present invention is that, as with all top-down design approaches, the foregoing is a process of architectural refinement in which design realization moves down through levels of abstraction. The characteristics of VHDL and the disclosed methodology enable this process to occur without losing the intent and meaning present at higher levels. This is the key to automating the process.

Another important feature is that the partitioning step, or partitioner, in effect, uses high-level timing information extracted from the chip floorplan to constrain the design into the feasible architectural choices which meet the high-level timing goals. These constraints are key to allowing the process to converge to specific physical embodiments.

Another important feature is that the methodology enables timing closure without going to actual layout, solving one of the most difficult problems in design automation today, namely the inability to get timing closure at even the gate level effectively which in the past has forced designers to create two designs: a logic design and a timing design. Using the methodology disclosed herein, timing closure can be obtained by using a form of back annotation which will extract timing data from floorplanning-level layouts and then incorporate this data into the I/O (Input/Output) ports of the VHDL behavioral description.

According to an aspect of the invention, the behavioral (VHDL) description of the device is interpreted by attaching one or more semantic rules to each of the syntactic rules underlying the behavioral description. This is accomplished (such as via Prolog) using a "syntax attributed tree".

Further, according to the invention, objects related to specification and validation are provided by a combination of formal techniques such as model checking, mathematical theorem proving and symbolic simulation to handle a large class of circuits. These techniques are provided in an integrated environment which acts as a sounding board for the system designer to "try out" system concepts. The system designer is thus assisted in putting together a formal specification suitable as a starting point for subsequent refinement. The value of this environment is in providing the designer with an increased chance of success with an implementation with a minimum number of design iterations and specification changes.

According to an aspect of the invention, specification for a complex digital system is entered using a formal specification language, in an iterative, interactive process on an ECAD system. The formal specification language is entered directly on (or transferred to) the ECAD system in computer-readable form, and is operated upon directly by the interactive, iterative process. This process checks the specification for syntactical correctness and logical consistency. A combination of formal techniques including mathematical theorem proving, model checking and symbolic simulation are used to verify the "viability" of the system (i.e., the existence of at least one realizable implementation of the system) as specified.

According to another aspect of the invention, a query mechanism is provided within the interactive, iterative process so that the system designer (i.e., the one who enters the specification) can obtain information about relational properties between portions of the digital system. These properties are a natural fallout of the verification and theorem-proving processes.

According to another aspect of the invention, an "oracle", or expert system is provided so that the system designer can get suggestions from the ECAD system on how to approach various parts of the system design.

Further, according to the invention, a formal verification process is provided to thoroughly check the system design for possible errors early on in the specification description process. Formal verification is also made available for system verification. Logic verification techniques are used to ensure the correctness of the system design, as implemented.

Further, according to the invention, subsequent specification revisions (resulting from e.g., discovery of problems or change of system objectives) are subjected to the same level of automated scrutiny, helping to ensure that the revisions do not cause erroneous system behavior.

By entering the specification in the above-described interactive, iterative process, an environment is created which acts as a sounding board for the system designer to evaluate system concepts during the specification process. As the concepts evolve, so evolves the specification. Once a satisfactory concept is reached, it is guaranteed (by formal verification) that a realizable implementation of the specification exists. This greatly increases the probability of a successful implementation with a minimum number of iterations and specification changes.

Further, according to the invention, formal methods are used during the refinement (iterative design/revision cycles) of the specification. At each stage in the design process, a specification is transformed into an implementation. For example, a design could progress from a specification level to an architectural level, behavioral level, register-transfer level, gate level, switch level, polygon (layout) level, and eventually into a physical implementation (e.g., silicon integrated circuit or system of integrated circuits). An implementation from each stage (level) provides the specification for a subsequent implementation at a subsequent stage (level). Introducing formal verification techniques between key stages in the design process helps to increase the level of confidence in the resulting design and improves the chances of obtaining a "correct" implementation. (A "correct" implementation, as used herein, means an implementation which satisfies all levels of design specification and results in a system which behaves as desired.)

Other objects, features and advantages of the invention will become apparent in light of the following description thereof.

DETAILED DESCRIPTION OF THE INVENTION

Introductory Comments

Figure 1:
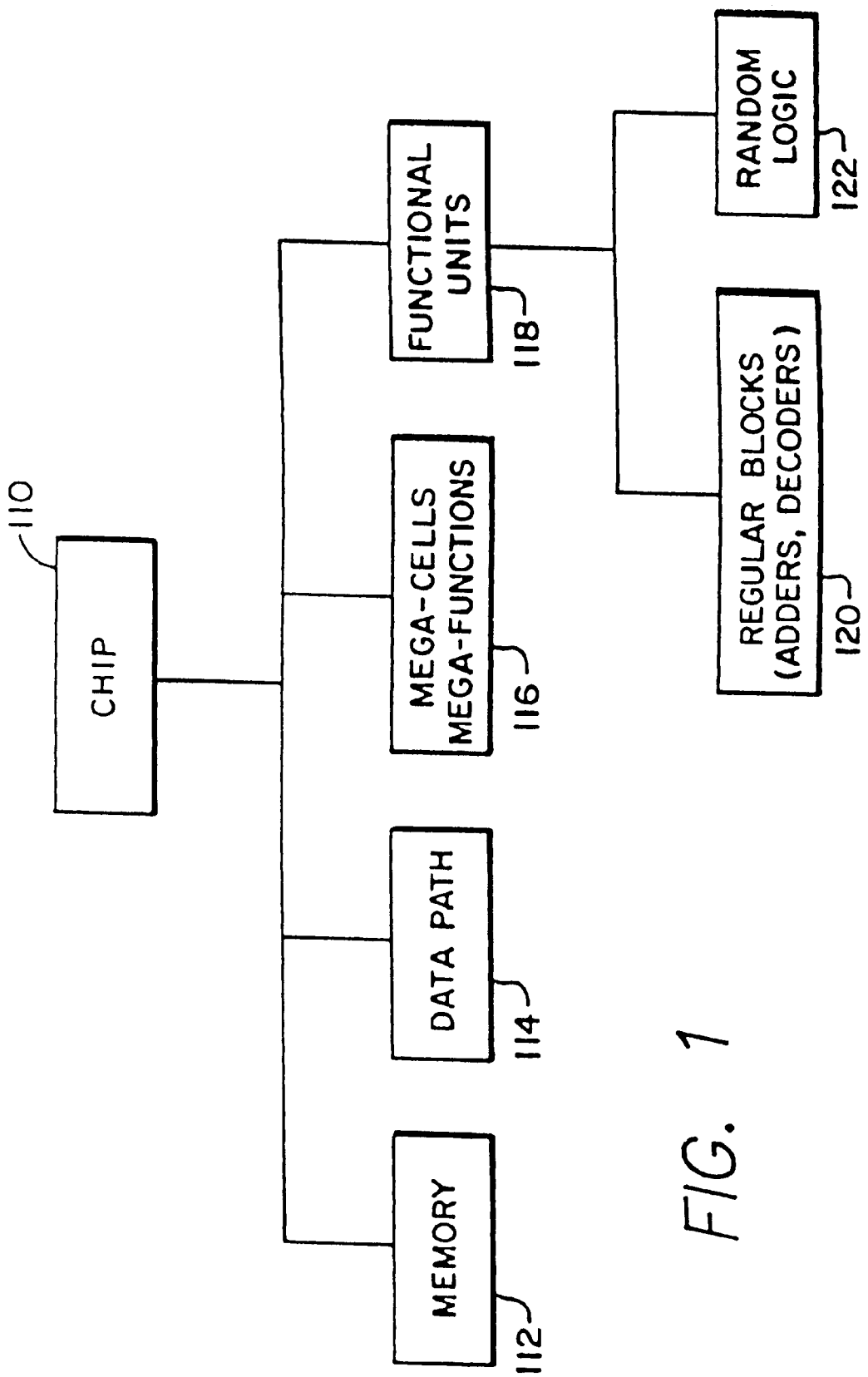
FIGS. 1–7 are schematic representations of the methodology of the present invention.

In modern digital systems, designs incorporating 70,000 logic gates or more are not uncommon. Also, in modern analog electronic systems, especially where the function being designed is intended to be incorporated into an integrated circuit, it is not uncommon to encounter designs comprising many hundreds of transistors and other electronic devices. These designs, due to their complexity, present a need for frequent simulation of the circuit being designed in small parts before it is simulated as a whole. This is necessary because errors in a small portion of the circuit are easy to detect when that small portion is simulated in isolation. On the other hand, when the entire circuit is simulated, compound errors may occur which mask other errors. Further the enormity of modern circuit complexity makes the errors in the small portion of the circuit difficult to recognize.

In the prior art, the process of designing an electronic circuit on a typical ECAD (Electronic CAD) system is done in several discrete steps. A schematic diagram of the circuit is entered interactively through the use of a schematic editor which produces a digital representation of the circuit elements and their interconnections. The user of the ECAD system then prepares a list of input stimuli (vectors) representing real input values to be applied to the simulation model of the circuit. This representation is then compiled by a schematic compiler and translated into a form which is best suited to simulation. This new, translated representation of the circuit is then operated upon by a simulator, which produces numerical outputs analogous to the response of a real circuit with the same inputs applied. This output is then usually presented to the user in a graphical fashion. By viewing the simulation results, the user may then determine if the represented circuit will perform correctly when it is constructed. If not, he may then re-edit the schematic of the circuit using the schematic editor, re-compile and re-simulate. This process is performed iteratively until the user is satisfied that the design of the circuit is correct.

The schematic editor of the ECAD system is usually an interactive software tool which enables the user to select from a number of circuit elements which will be graphically displayed upon a graphical/text display device, hereinafter referred to as the display screen, connected to the computer. These displayed elements may then be interconnected by lines representing wires drawn on the display screen by the user through interaction with the computer via a position input device, which may be a pointing device such as a mouse, trackball, joystick, graphic tablet, or keyboard used to enter coordinates on the display screen and commands to the software tool. The circuit elements and their interconnecting wires form a schematic diagram which is viewed either in whole or in part on the display screen. As the schematic diagram is constructed on the display screen, the computer represents these elements in a storage medium, which may be a memory or a mass storage device such a magnetic disk drive. These representations, taken as a group, form a numerical representation of the schematic which has been entered by the user in a standardized form which is understood by the schematic editor. Typically, this form has been optimized for the entry and modification of schematic information.

Often, schematic editors allow for hierarchical design whereby a previously created and stored schematic may be recalled and viewed and used as a macro-level component in other circuits. Multiple instances of such macro-level components may be included in a higher-level schematic diagram. The schematic editor creates data structures effectively replicating the macro-level component. The higher-level schematic may further be incorporated as a macro-level component into yet higher-level schematic diagrams, and so on.

FIG. 12

Figure 12:
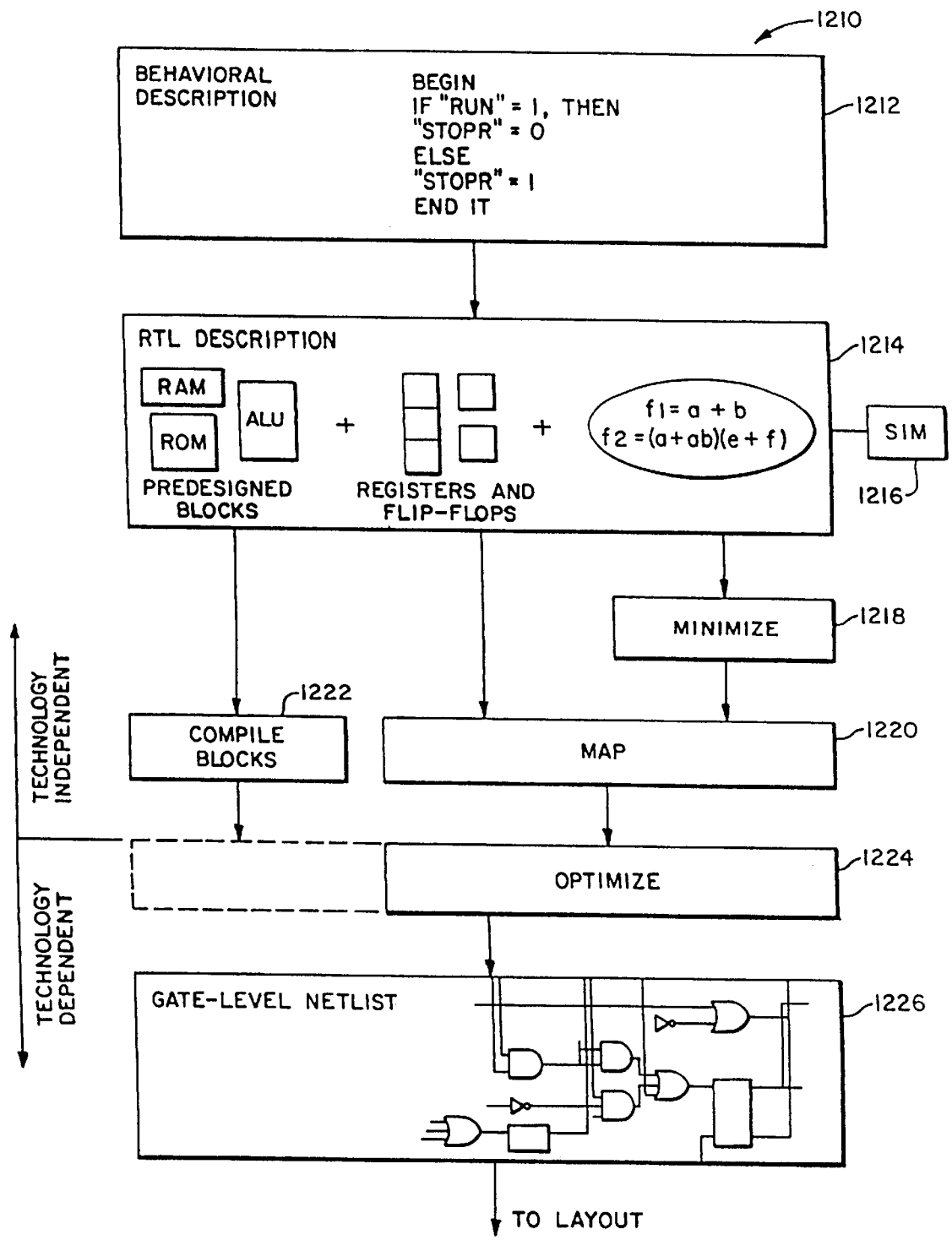
FIG. 12 is a block diagram of a generalized logic synthesis methodology, lacking critical features of the present invention.

FIG. 12 shows a generalized design methodology 1210. It should be understood that the descriptions contained herein are in terms of a suite of software "blocks" that can be run on any suitable computer system (not shown).

A designer begins designing a circuit (or system) by formulating a behavioral description of a circuit's desired behavior in a high-level computer language, such as VHDL. This is represented in the block 1212, which shows exemplary high-level code describing a desired behavior.

Next, the designer re-formulates the design as a register transfer level (RTL) description of the circuit in terms of pre-designed functional blocks, such as memories and registers. This is represented in the block 1214.

The resulting RTL description is simulated in a block 1216, to ensure that it equates to the original behavioral description. At that point, the design consists of synthesizable parts (combinational logic, registers and flip-flops) and non-synthesizable parts (pre-designed blocks).

The logic is then minimized in a block 1218, by finding common terms that can be used repeatedly, and maps the description into a specific technology (e.g., CMOS) in a block 1220. Further, the non-synthesizable parts are compiled in a block 1222.

The foregoing steps 1212 through 1222 are all technology independent (except for the step 1222, to the extend that it is technology dependent).

The design of at least the synthesizable parts is optimized in a block 1224 to produce a gate-level net list 1226.

The blocks 1218 through 1222 represent a typical logic synthesis tool.

Strictly speaking, only the steps after the RTL description is produced constitute "logic synthesis", and such a bottom-up approach (re-formulating the behavioral description into a RTL description) tends to be flattened out and/or lose much of the intent of the original behavioral description, as well as being labor-intensive and error-prone.

According to the present invention, described below, "behavioral synthesis" will bridge the gap between a behavioral description and a RTL description to produce a valid gate-level net list automatically from a high-level behavioral description. In a sense, behavioral (e.g., VHDL) and RTL circuit descriptions can both be considered "high-level" descriptions, since they do not deal with gate-level representations. The distinction between a behavioral description and a RTL description is primarily in the amount of structure that they specify and in the "allocation" or definition of structural components that will be used in the resulting gate-level implementations. Behavioral descriptions do not address the issue of what specific structural components (e.g. memory, functional blocks, etc.) are to be used. In an RTL description, structural components are explicitly identified and there is a direct mapping between this description and the resulting gate-level implementation.

The ability to synthesize behavioral and RTL descriptions is significantly impacted by this difference in structural content. RTL synthesis ("low-level" synthesis) is a relatively well-studied, and much implemented, technology. The ability to synthesize an RTL description into a gate-level implementation is well established.

The present invention discloses a methodology for mapping a behavioral description with little or no structural content into a RTL level description with significant structural content. This is largely, but not entirely, a top-down design methodology.

What is lacking in a strictly top-down design methodology is the use of detailed knowledge of lower level physical information of the modules (circuits, functional blocks, etc.) being designed. Typically, the decisions concerning the selection and placement of modules are deferred until the time the behavioral synthesis is complete and an RTL structure has been chosen for the implementation. The reason for this is that, typically, structural information is not available at the behavioral level, and hence the system is unable to employ criteria such as area and delays while exploring the design space. Details such as layout, module size and interconnect can have an enormous effect on the shape of the RTL design space.

As will become evident hereinafter, partitioning the design at a high level (behavioral description) into architectural blocks creates a "vehicle" for providing such structural information at the behavioral description level, thereby adding the ability to estimate lower-level physical parameters. Further, partitioning helps the designer explore other avenues such as operator level parallelism and process level concurrency in order to improve the design.

FIGS. 1–8

There follows an exemplary embodiment of the invention described in the context of an ASIC design.

FIG. 1

FIG. 1 is a simplistic view of an ASIC chip 110, covering gate arrays and standard cells, in the context of synthesis. In general, an ASIC chip consists or all or some of the different functional entities shown in the Figure. Moreover, the Figure describes means for synthesis/compilation and optimization of these blocks. Not shown in the Figure are the chip's I/O buffers and periphery. Although synthesis tools are not meant to manipulate I/O buffers, nevertheless their timing description in the optimization environment can be beneficial for optimization of the chip's core part.

The exemplary chip 110 includes the following major functional blocks: memory 112, data path 114, mega-cells and mega-functions 116 and functional units 118 which may include regular blocks 120 such as adders and decoders and random logic 122.

The memory block 112 is generated by memory compilers using efficient technology-dependent building blocks. The output of the memory compiler is a net list of primitive transistors.

The data path block 114 is generated by providing the behavioral description in an HDL (Hardware Definition Language) language. The data paths can be synthesized through general purpose synthesis programs or specialized data path compilers. The output of the synthesis programs/compilers is the structural description of the design using ASIC macro-cells.

The mega-cell and mega-function block 116 is chosen from pre-designed building block libraries, which are already designed for optimal performance.

The regular functional units 120 are generated using regular blocks such as adders, decoders and multiplexers. These blocks can be further optimized, if desired.

The random logic blocks 122 includes random logic, glue logic and the state controller. The description of these units is provided in Boolean equations, truth table, data flow and HDL description. This part of the chip is designed around the other parts. This functional unit is partitioned into smaller chunks of functional units, and the process is recursively repeated. The atomic features are still functional units that are readily functionally verifiable. A general purpose synthesis/optimization tool is used to create these functional units, and to optimize the units according to the specified constraints and those imposed by memory, regular blocks and data path sections.

FIGS. 2–5

FIGS. 2–5 describe a synthesis design methodology that is independent of any particular design style or technology. The various steps (blocks) of this methodology are represented by the circled numerals 1–18, and are as follows:

Step 1 is Design Specification. This consists of system (device) specification and may include functional specifications of subsystem elements, timing specifications and I/O requirements, and power, package and interface requirements.

Step 2 is Design Description. This is the functional description of the design and all its subsystem elements. The description is, ideally, given in a high level description language, such as VHDL. Depending on the nature of the design, the description can be entirely at the behavioral level, or it may be intertwined with an RTL description.

Figure 13:
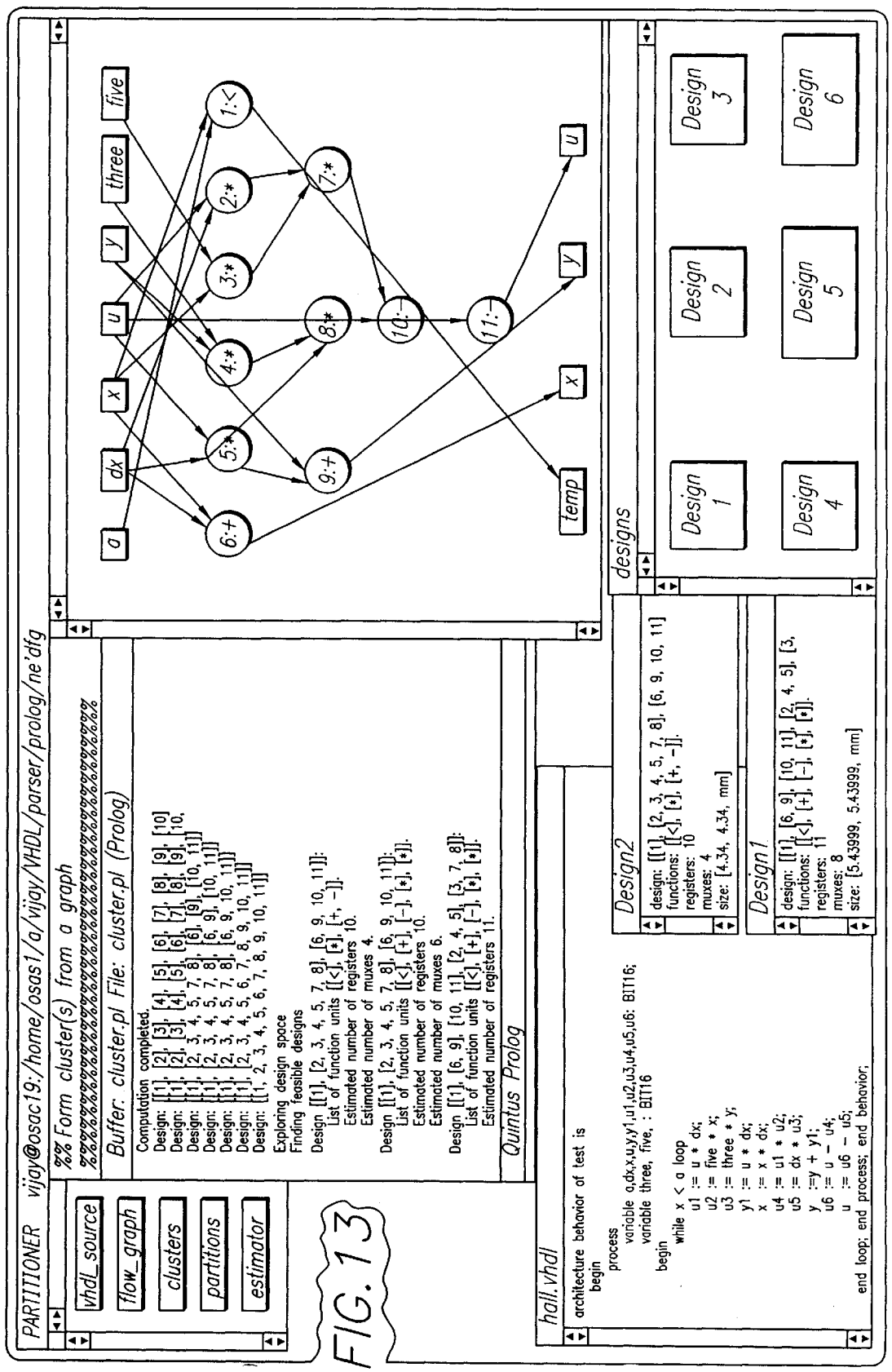
FIGS. 13–15 are exemplary screen displays generated by a computer system employing the methodology of the present invention.
Figure 14:
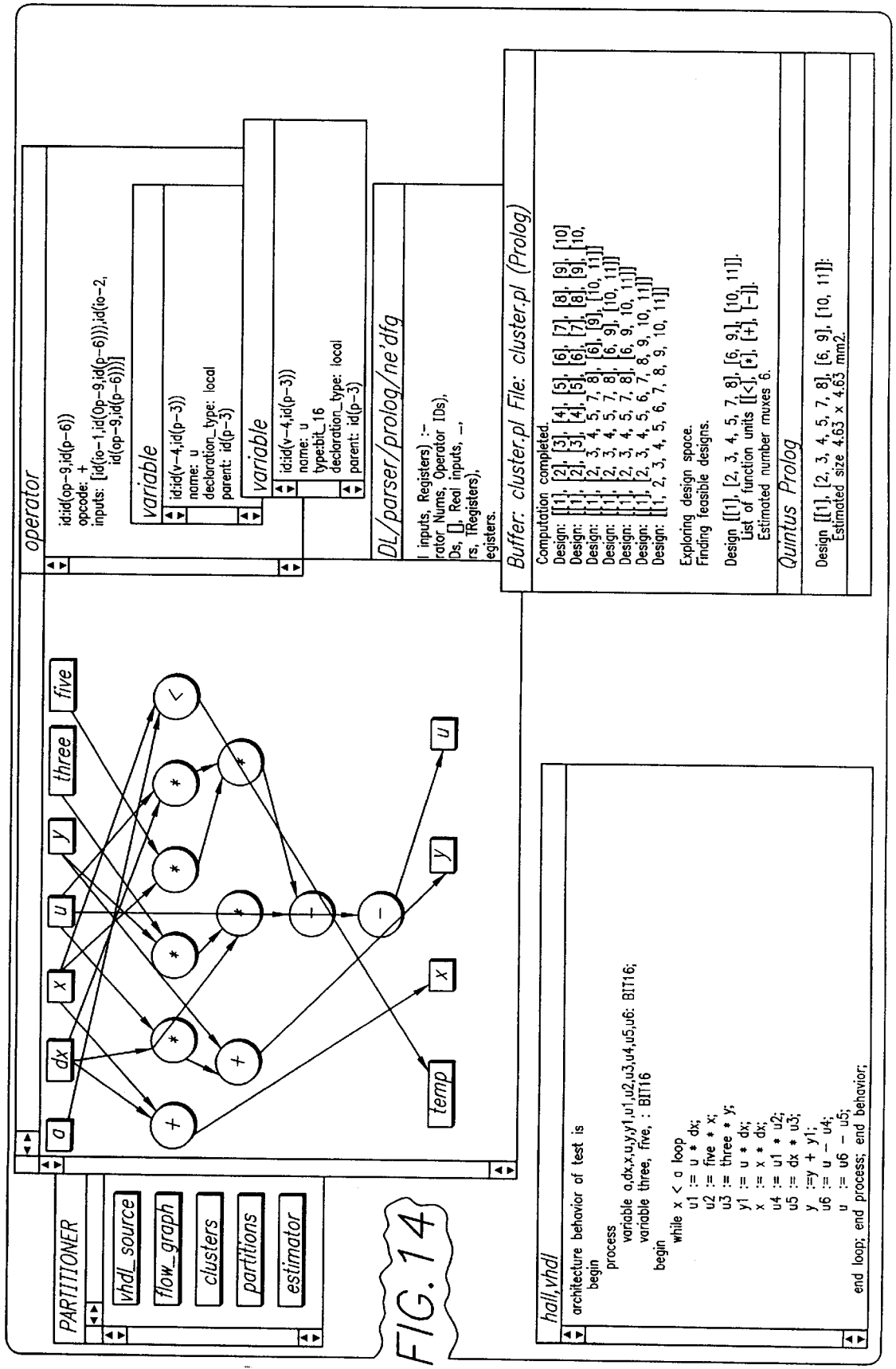
Figure 15:
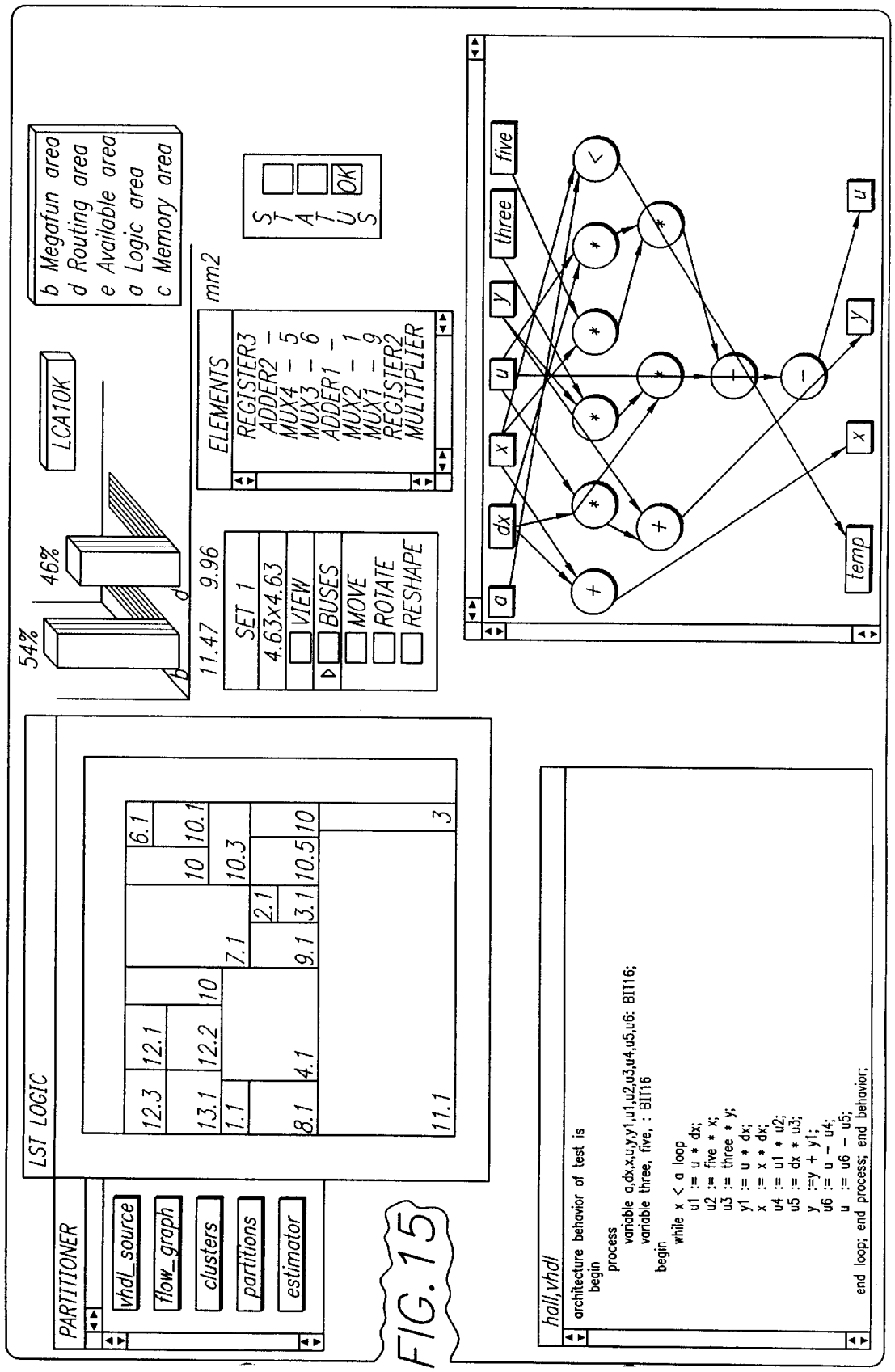

Step 3 is Partitioning. Given the behavioral description of the design, partitioning (the Partitioner) breaks the design into separate modules that will make the overall synthesis, analysis and verification tasks more manageable. In doing so, the Partitioner consults technology files (described hereinafter) containing packaging, I/O capabilities and other technology-dependent information to optimally partition the design. In addition to functionally partitioning the design, the Partitioner can help the designer (see FIGS. 13–15 showing representative screen displays of the CAE system) in choosing the optimal architecture that would optimize the design, e.g. in terms of area and speed.

Step 4 is Module Description. Three modules are shown, but there could be many more modules involved. This is the RTL description of the partitioned design, in terms of an HDL (hardware definition language) description. Each module is accompanied with a set of timing and area constraints, which are related only to that module's domain (they are not automatically derived from the design description).

Step 5 is Composition. Composition is the opposite of partitioning, and facilitates examination and verification of the partitioned design. The partitioned design is reconstructed in this step, the end product of which is an RTL description of the entire design.

Step 6 is Functional Verification (Behavioral). Verification at the behavioral level is performed at two stages—while the design is being developed, and after the partitioning step. The former is source code debugging where the high level description of the design is verified for correctness of the intended functionality. The latter is to verify the architectural decisions that were made during partitioning, and to examine their impact on the functionality and performance of the entire design.

Figure 2:
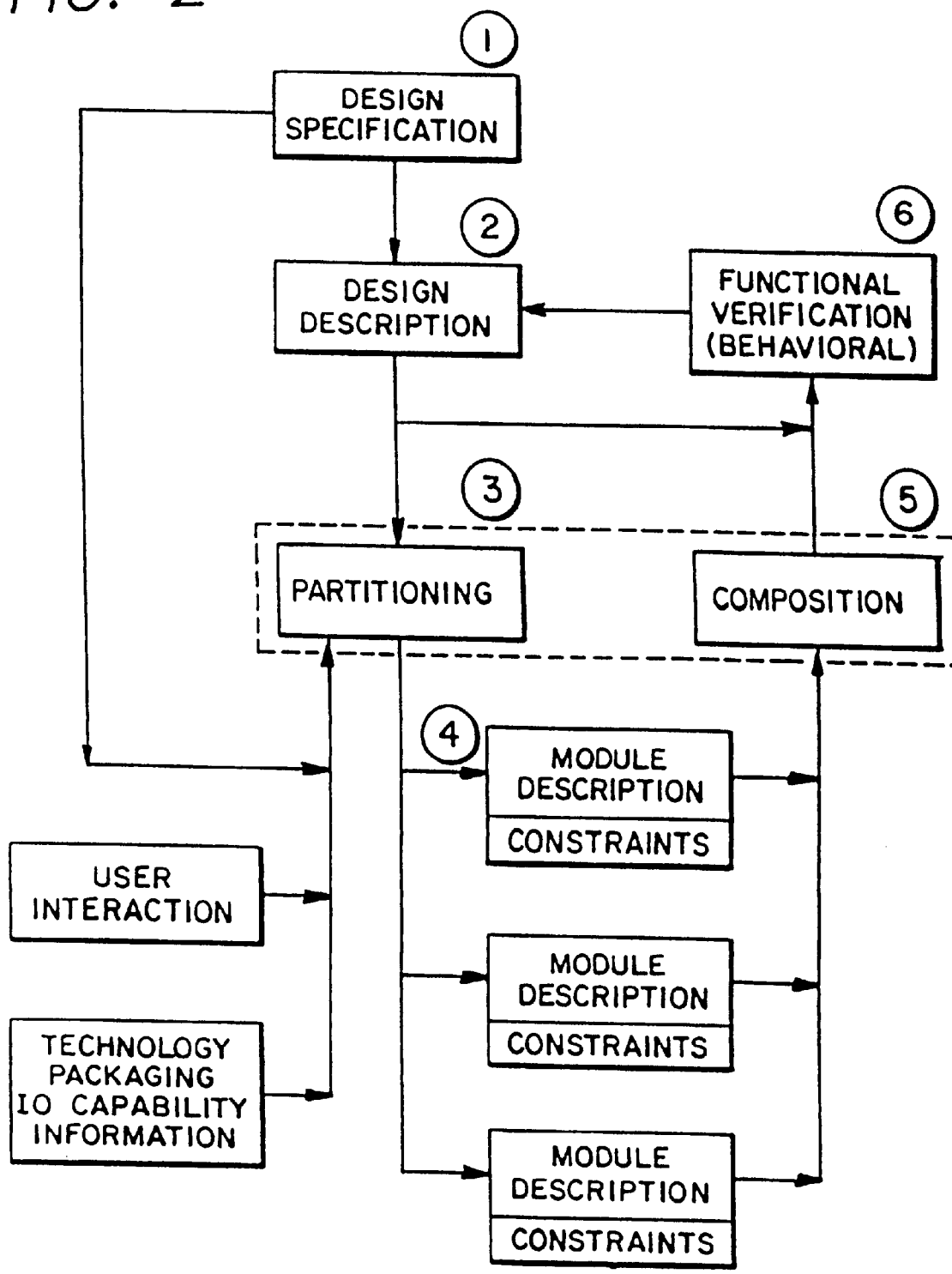
Figure 4:
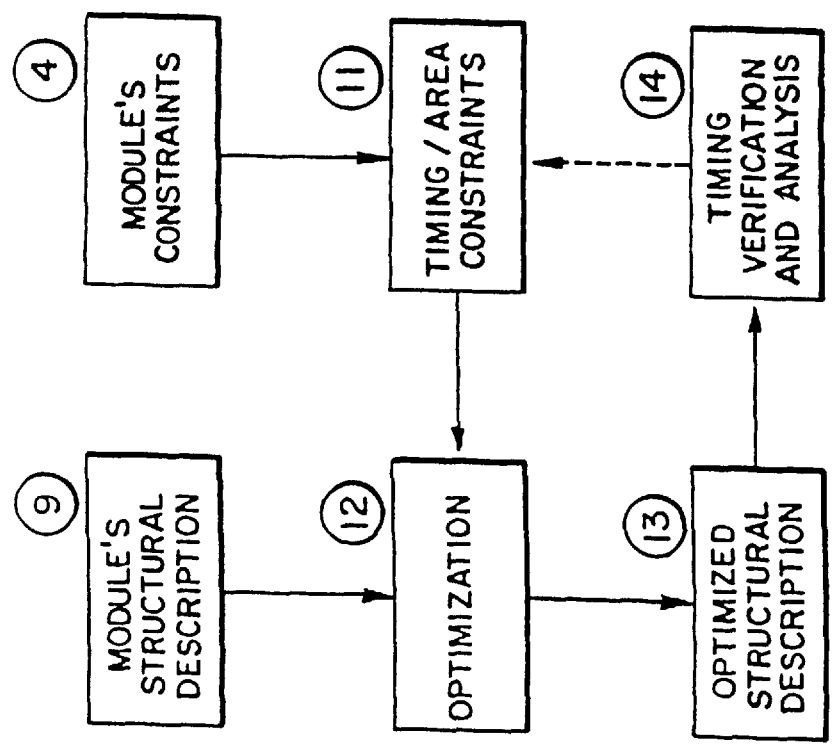
Figure 3:
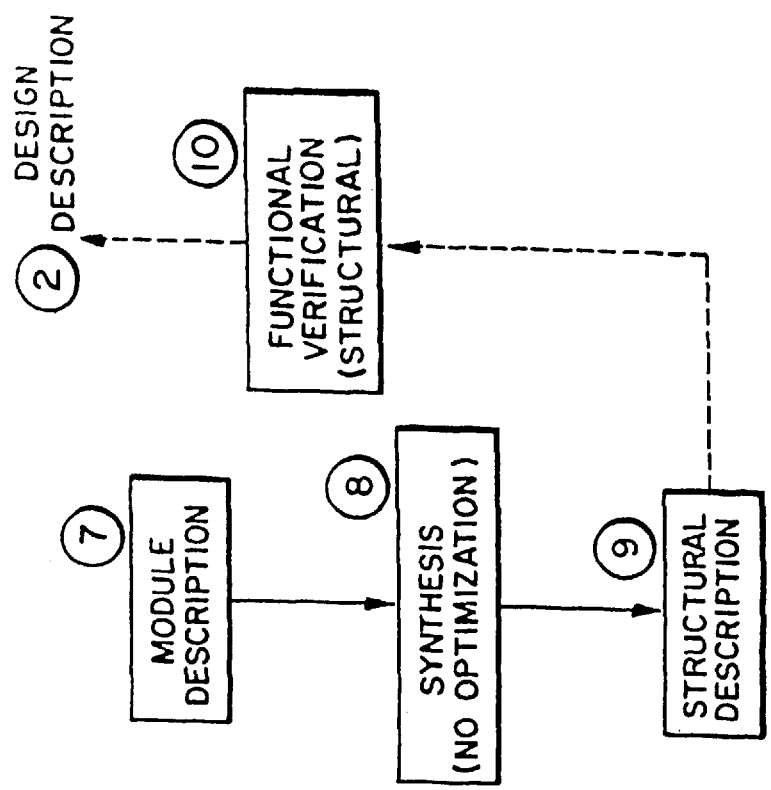
Figure 5:
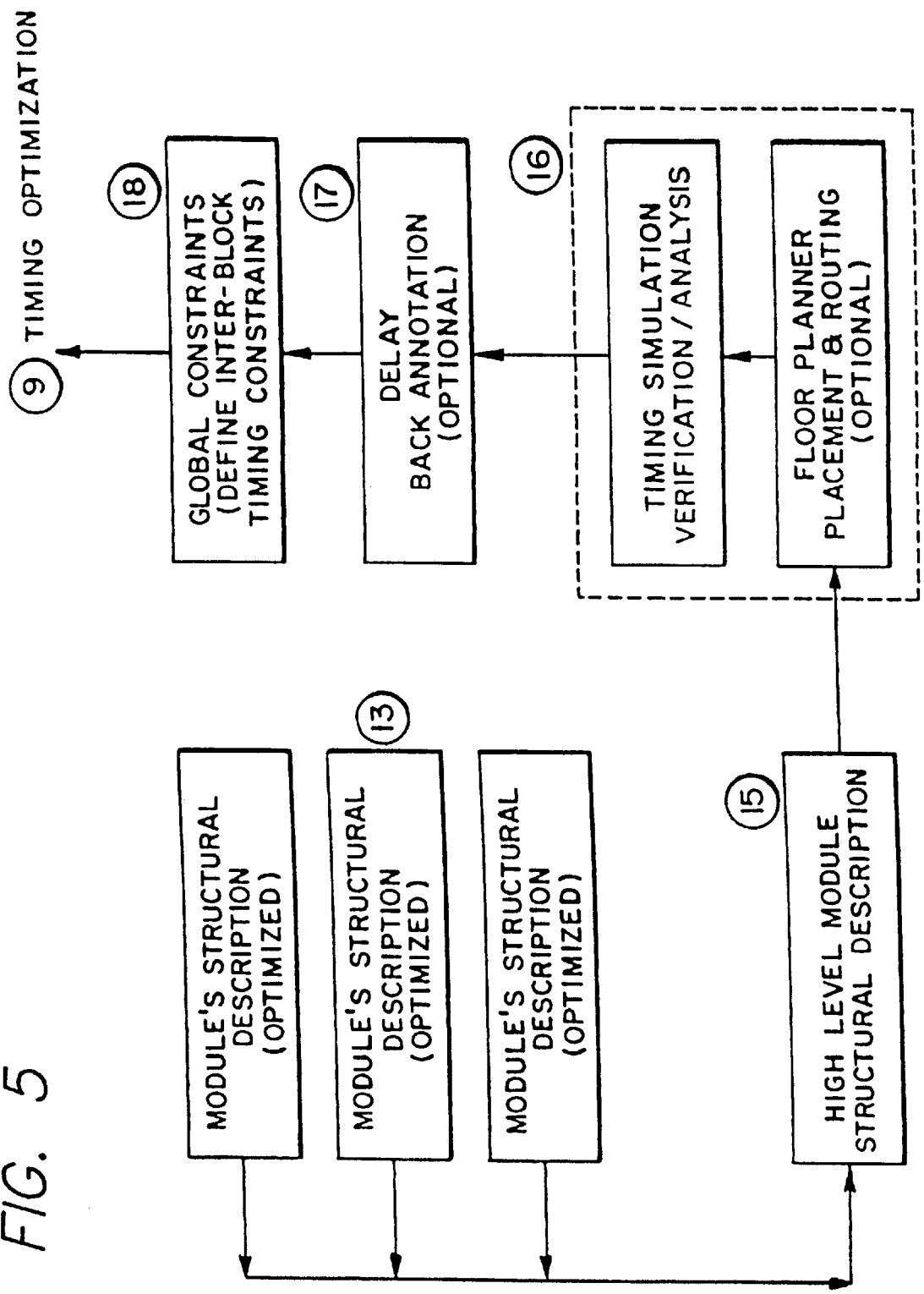

It will be noticed, in the above description of the steps shown in FIG. 2, that various "loops" are formed. A high level loop consists of behavioral verification (step 6) to debug the design description (step 2). A lower level loop consists of behavioral verification (step 6) of the partitioned (step 3) and composed (step 5) design. The partitioning process is guided by user interaction, and is driven by physical implementation factors such as technology, packaging, I/O capability and other information about the proposed device which is developed based on experience with similar devices.

Step 7 is Module Description. This is the description of a functional entity that is produced by the Partitioner or developed independently by the designer. This is preferably given in one of the following formats: HDL, truth table, equations or net list. As used in this example, a "module" is a functional block with a complexity of less than 3000 cells (it is not a chip with I/O pads).

Step 8 is Synthesis. Given the module description (step 7) and a target technology library, the design is mapped into the target technology. The synthesis process usually includes some form of logic optimization. This is the task of manipulating the logic expressions that define the functionality of the module (device). Minimization is done by removing redundancies, and adding or removing intermediate levels of logic (e.g., restructuring of Boolean expressions).

Step 9 is Structural Description. This is the gate-level, technology-dependent description of the module produced by the synthesis tool. It is usually given in the form of a net list, from which a device can be automatically physically created.

Step 10 is Functional Verification (Structural). This is done to verify the correctness of the module against the intended functionality. This is only required if functional verification at the behavioral level (step 6) has not been performed. One assumes that the circuit generated by the synthesis tool complies (functionally) with the given module description. In case of discrepancies, the module description needs to be modified (debugged) at the top level, i.e. Design Description (step 2). This is necessary in order to preserve the integrity of the design and all of its subsystem elements.

Step 11 deals with Timing/Area Constraints. These are used to customize the optimization process. Optimization is usually driven by area and speed (timing) constraints. These might instruct the tool to perform rudimentary area versus speed trade off on individual or small clusters of gates, or to perform comprehensive area and speed optimizations in combination with other constraints such as drive capability. A rich set of constraint constructs is required for meaningful design optimization, and are provided in the methodology of this invention. Timing constraints may include the following: maximum and minimum rise/fall delay, set-up and hold check, length of clock cycle and maximum transition time per net. The timing constraints may also include boundary conditions, such as signal skew at the module's inputs, drive capabilities of the modules outputs, etc., when such data is available.

Step 12 is Optimization. Given the design constraints and the module's structural description, the optimization process tries to modify the module so that its area and timing characteristics comply with the specified constraints. Depending on the nature of the design and the strength of the constraints, some or all optimization goals will be achieved. When no boundary conditions are available, optimization may be general purpose, aimed at minimization of the overall module. With boundary conditions, the objective is to optimize each module so that the overall higher level module complies with the specified timing requirements.

Step (block) 13 represents generating the Structural Description of the module after the optimization process.

Step 14 is Timing Verification and Analysis. This is a process of examining the effects of the optimization process (step 12), and examining its global impact. Tools such as static timing analyzers and gate level simulators would be employed. If the optimized module (step 13) does not meet all of the timing and area requirements, further trade-offs have to be made at this point. The constraints are then modified to reflect these trade-offs, and the optimization process (step 12) is repeated.

Step 15 represents a high level module, derived from the module's optimized Structural Description (step 13). A high level module consists of one or more sub-modules. Each sub-module has been optimized in its own domain. The high level module describes the interaction and connectivity between the sub-modules. When hierarchically applied, the target device itself is considered to be a high level module.

Step 16 is Timing Simulation, Verification and Analysis. At this stage, the optimized modules are composed (see step 5) together and implement the intended functionality of the high level module, or target device. Here, analysis includes logic level simulation, static timing analysis, electrical rule checking, etc. For more accurate analysis, it might be necessary to use a floorplanner or placement and routing programs to estimate wire delays. The wire delays are then back annotated into the design database prior to simulation. If the overall timing characteristics of the modules do not meet the specified requirement, the timing constraints of the sub-modules are modified and optimization is performed.

Step 17 is Delay Back Annotation (DBA), which is optional. The inter-block wire delays can be more accurately estimated only after floor-planning of the sub-modules. More accurate intra-block and inter-block delays are determined after the placement and routing stage. Using these tools, the wire delays can be estimated more accurately. The delays can be back annotated to be used by the gate level Optimizer (step 12).

Step 18 represents introducing Global Constraints. Using the results of the analysis performed, the sub-modules' timing/area constraints are modified to reflect the global timing requirements. Sub-modules with new constraints are then re-optimized.

FIG. 6

Figure 6:
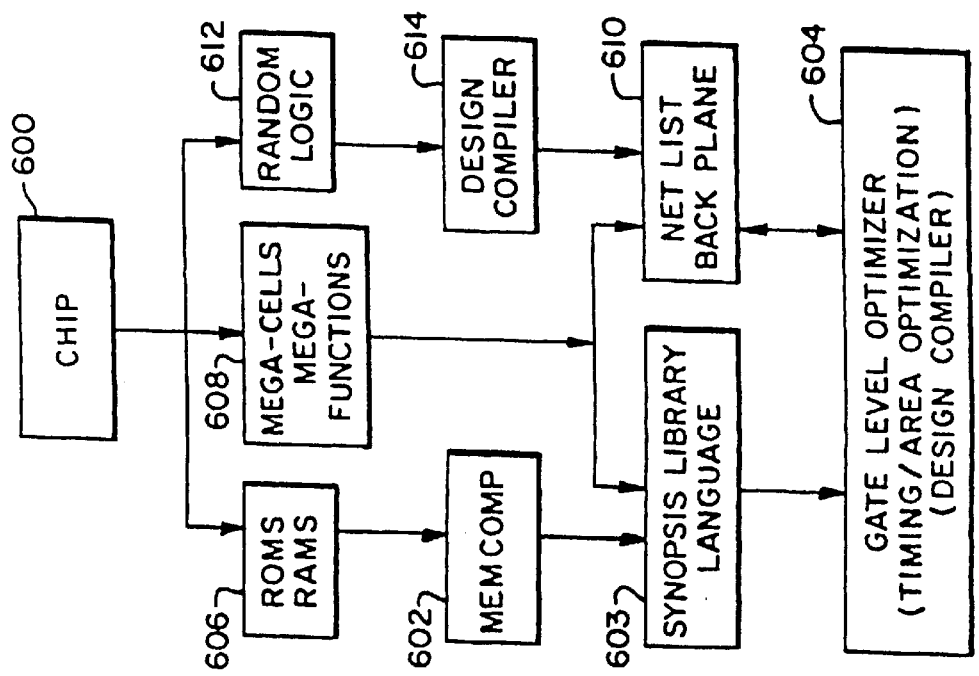

FIG. 6 illustrates the usage of exemplary synthesis and optimization tools, and the abstraction level for the exchange of design data between these tools and a Design Compiler. Each tool addresses the synthesis or compilation of one or more of the major functional blocks of an exemplary ASIC chip 600. The usage of these tools and their interaction with the Design Compiler are of particular interest.

A Memory Compiler (MemComp) 602 takes the high level specification for memory mega-cells and produces logic and layout files for the purpose of simulation, testing and layout. The objective is to provide the Design Compiler (Optimizer) 604 with an accurate timing description of and drive capability information for the memory block. MemComp synthesizes high density or low power RAM or ROM blocks 606. As will become evident, the surrounding logic is optimized with respect to the memory block. The memory block created by MemComp 602 is provided in the same format as the internal macro-cells, i.e. a net list of primitive transistors, which cannot be read directly by the Design Compiler 604. Therefore, one of two possible intermediate steps is required: 1) (not shown) the data sheet generated by MemComp is used to manually extract the timing description of the memory block. This basically involves defining a set of "set_load", "set_drive" and "set_arrival" constraints and associating them with the relevant pins of the surrounding logic at the start of the optimization process; or 2) a Memory Modeler (see FIG. 8) is used to generate a model 603 in Synopsys Library Language (SLL; available from LSI Logic Corporation). The Memory Modeler reads the memory description and generates a complete timing description of the memory block. This contains all of the setup and hold values and the timing arcs and I/O pin characteristics. This task is similar to that of the Synthesis Library Model (SLM; available from LSI Logic Corporation) generator.

Mega-cells and mega-functions 608 are treated as basic building blocks, similar to the macro-cells in the synthesis library. Both are generally developed beforehand for optimal performance, so no optimization is required on these blocks. They are presented to the Design Compiler 604 simply to provide timing information so that the surrounding blocks can be optimized. The mega-cells are modeled in the same manner as the macro-cells, i.e. by using the Synopsis (SLL) library format. The mega-functions are ported into the Design Compiler in Synopsys DataBase (SDB) format. (The netlist back plane 610 is used as the primary design representation medium). Generally, the mega-functions model industry-standard functions, thereby providing the designer with a set of popular and proven standard building blocks. In the case of certain, highly-specialized, user-defined mega-functions, it would be necessary to ensure appropriate capability in the Design Compiler.

Random logic 612, in other words the remaining modules that were not synthesized using the previously described tools and libraries, are synthesized by a general purpose logic synthesis tool 614 that optimizes the design for speed and area. It accepts hierarchical combinational and sequential design descriptions in equation, truth table, net list and/or VHDL formats. The optimization process is directed by specifying the "goals". Goals are represented as timing constraints. The optimization process makes trade-off evaluations and produces the best possible gate level implementation of the design for the specified constraints.

Since the Design Compiler 604 provides an environment for synthesis and constraint-driven optimization, it can be used as the overall synthesizer/optimizer. Blocks created by other tools can be loaded into the Design Compiler, where the timing information from these blocks can be used to synthesize and optimize the surrounding logic. For example, knowing the drive capabilities and the skews of the memory blocks' outputs would allow for accurate optimization of the glue logic.

Figure 8:
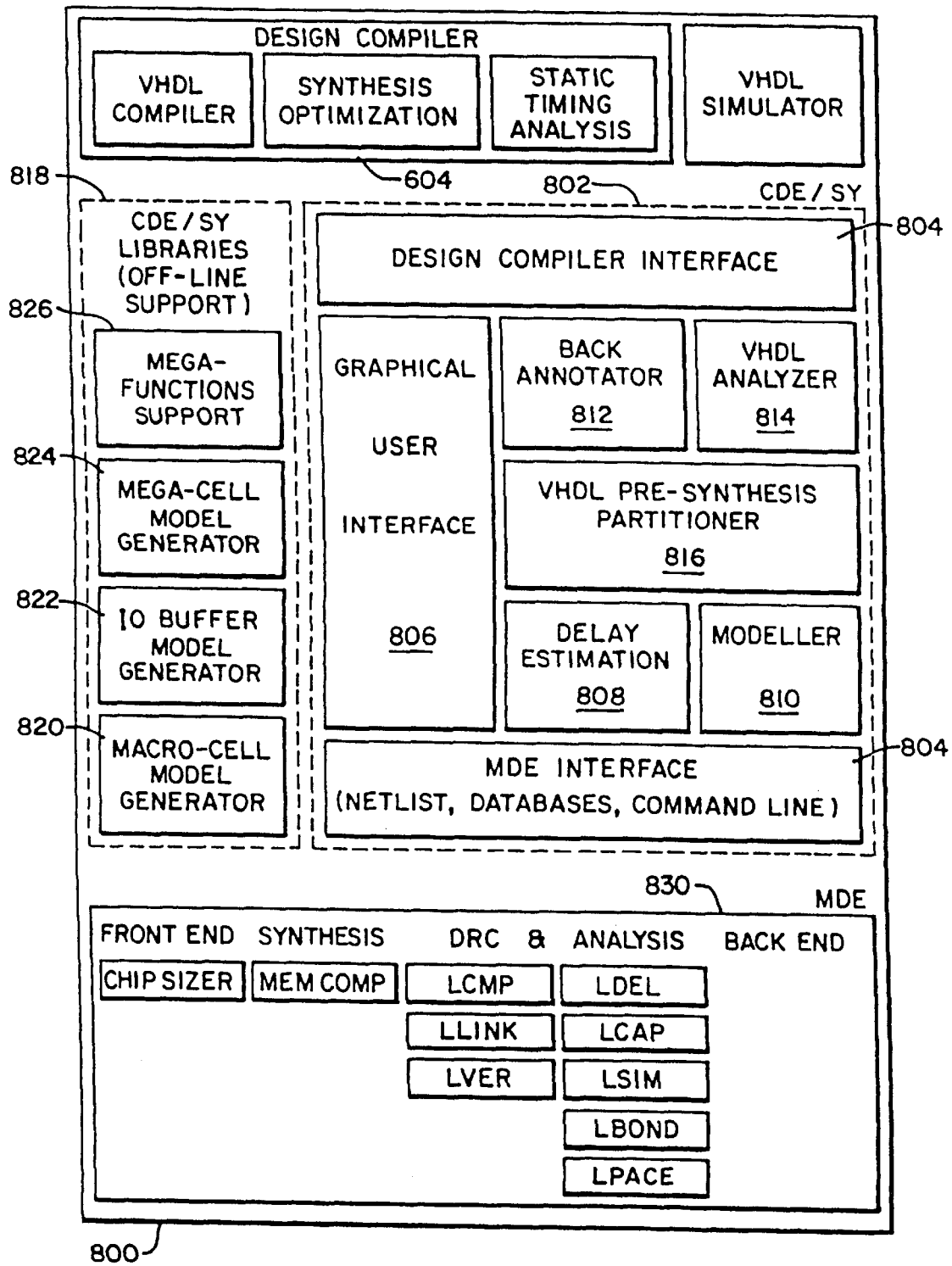
FIG. 8 is a block diagram of a suite of exemplary software tools for implementing the methodology disclosed in FIGS. 1–7.

Once the memory blocks are synthesized, and the appropriate mega-cells and mega-functions are chosen, the remainder of the design can be synthesized by the Design Compiler. Optimization is then performed according to user-defined timing constraints (see User Interface; FIG. 8) and those dictated by existing blocks. This is an iterative process. Constraints need to be refined until the desired timing and area requirements are achieved.

FIG. 7

Figure 7:
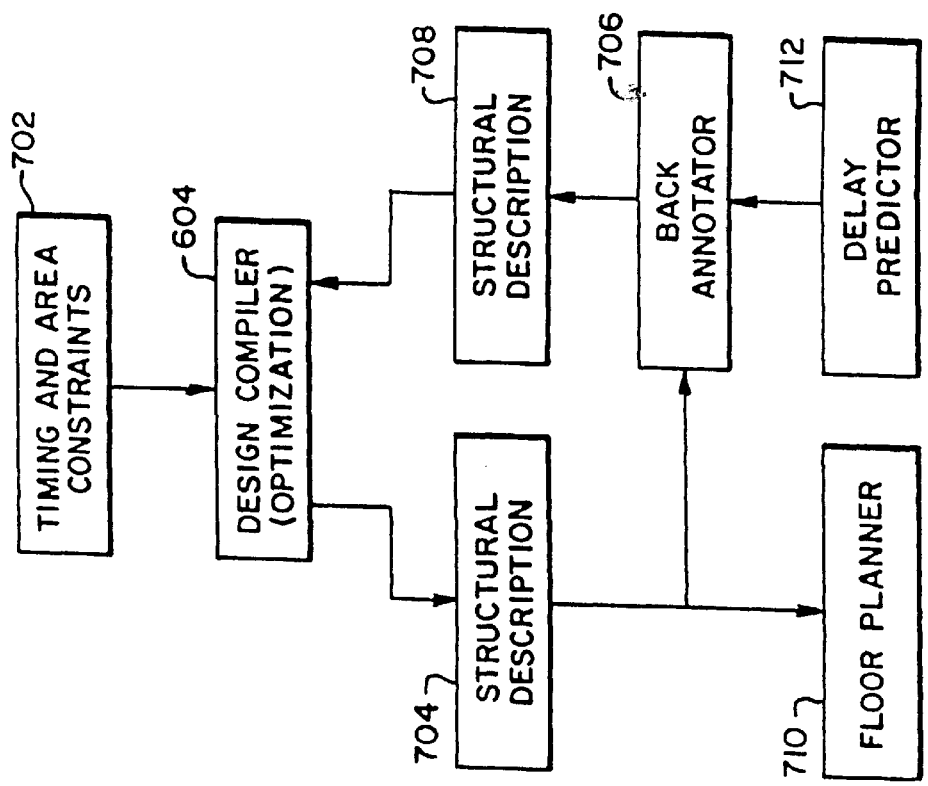

FIG. 7 shows a synthesis design framework. The objectives of the disclosed framework are: to provide a unified front end for a set of synthesis and optimization tools; to provide an integrated synthesis environment by incorporating specialized synthesis tools with the Design Compiler, which is the main synthesis and optimization tool; to provide the capability of constraints-driven gate-level optimization of both sequential and combinational designs; to provide back annotation of wire delays from the Modular Design Environment (MDE; available from LSI Logic Corporation, described hereinafter) to the Design Compiler to make the necessary timing/area tradeoff evaluations based an more accurate wiring delays; to provide a window-based graphical interface between the synthesis tools and the MDE module to control the data flow between the Design Compiler, the other synthesis tools and the MDE; to provide VHDL debugging, and analysis capability to front-end synthesis from VHDL; and to provide VHDL pre-synthesis partitioning capability to front-and synthesis from VHDL.

Generally, the design framework illustrated in FIG. 7 follows from the design methodology described hereinbefore. The methodology includes the following important steps:

partitioning the design into memory blocks, mega-functions, mega-cells and random logic;

using a layout tool, such as LSI's ChipSizer (see FIG. 8), to obtain the required die size, which is a function of the area, the number of pins and pads and other factors;

choosing the mega-cells and mega-functions to be used, and characterizing the cells for the Design Compiler;

generating memory blocks, and characterizing them for the Design Compiler;

partitioning the random logic into smaller functional units;

using the Design Compiler to synthesize the remaining blocks, in a "bottom-up" manner, starting with the lower level functional units, including: verifying the functionality of the block using functional verification tools or simulators; optimizing the design for area or, in general terms, for timing of some or all of the selected paths; composing the higher level functional blocks and, when a functional block interfaces with an existing building block (e.g. memory, mega-cells, mega-functions), optimizing the functional unit (and all or some of its lower level units) according to the timing/area constraints 702 imposed by the building block; and repeating these steps until all of the functional units are synthesized into a structural description 704. The resulting structural description 704 may be back annotated 706 as a structural description 708 (of timing/area constraints) to the Design Compiler. In the loop shown:

for larger functional blocks, a floor planner 710 is used for placements and more accurate wire delay prediction 712 and, with this information, using the more accurate block size provided by the floor planner to re-estimate the internal wire delays of the lower level functional units and back-annotating these delays into the Design Compiler to provide more meaningful internal timing optimization, and/or using the wire delays of the inter-block buses and wires to derive the appropriate boundary constraints for timing optimization, i.e. to specify inter-block delays through constraint constructs; and incorporating the timing delays and drive capabilities of I/O buffers into the timing constraints. (The I/O buffers should be selected as early in the design cycle as possible).

FIG. 8

FIG. 8 provides an overview of the design framework, illustrating an exemplary suite of tools, many of which are commercially available (as individual units), for implementing the methodology of the present invention. Herein it is important to note that the methodology of the present invention augments many discrete software tools, such as those described herein, and provides enormously increased functionality in the context of behavioral synthesis, which otherwise would not be available by simply combining these tools.

The design framework, hereinafter termed the Co-Design Environment (CDE) 800 is divided into two sections: on-line design tools and off-line design tools. The on-line design tools are programs that are utilized directly or indirectly by the user during the design process, and are relatively generalized to handle a variety of design objectives. The off-line design tools are programs that generate libraries and models of the various building blocks for the Design Compiler, and may be very user-specific.

A first group 802 of on-line tools, labeled "CDE/SY", constitutes the dynamic part of the Co-Design Environment and includes the following:

A Design Compiler Interface 804 (shown in two parts) controls the data flow and interactions between the MDE and the Design Compiler 604. It enables the user to follow the process of the design from one environment to the other, and interacts with the MDE programs via script shells and a command line. Interactions with the Design Compiler are achieved through the dc-shell script and constraints files.

A Graphical User Interface (Graphical UI) 806 facilitates user interaction with the CDE by: abstracting out those steps of the design flow that do not require the designer's intervention, assisting and guiding the designer through the various stages of the design process as outlined by the synthesis framework, and assisting the designer in the composition of the constraints file for optimization.

A Block Level Delay Estimator 808 provides the optimization tool with pessimistic wire delays which, in turn, causes the optimizer to compensate by placing buffers in and around the block or to use high power gates all over the design, and is especially applicable to small functional blocks. An advantage of using the Block Level Delay Estimator is that in pre-place and pre-layout stages of the design, both the synthesis and the analysis tools consider the wire delays to be a function of fan-out only. Although this might be a good estimate for the purposes of analysis, it has some undesirable side effects on the optimization process. Usually, in the present methodology, optimization is performed on a functional block of less than a few thousand gates, but most existing wire delay algorithms (based on fan-out) are geared towards much larger, die-sized blocks. Hence the Block Level Delay Estimator provides more realistic estimates of wire delays for the block size being manipulated through the system, and provides appropriate tables (wire_loading) to be used by the Design Compiler.

A Memory Modeler 810 reads the net list of a memory block created by MemComp (See 602, FIG. 6), and generates a timing model (in SLL) to be used by the Design Compiler. The objective is to provide the Design Compiler with accurate timing information about the memory block. This will help the optimization process as the drive capabilities, the capacitive loads, and the setup and hold time of the memory I/O will automatically define some of the constraints for the surrounding logic.

A Delay Back Annotator (DBA) 812 comes into play after the floor planning stage, and provides more accurate wire delays into the optimization database. The DBA is used for two distinct purposes: 1) to back annotate wire delays for a block that is going to be re-optimized, using the latest (and most valid) delay values); and 2) to back annotate wire delays for a block that has been optimized and has met the design constraints, thereby providing the latest delay values for accurate modeling of the block so that surrounding blocks can better be optimized.

A VHDL Analyzer 814 provides source code (VHDL) debugging and assists in functional verification of the VHDL description. The VHDL Analyzer is discussed in greater detail in FIGS. 10 and 11, and in the annexed code listing.

A VHDL Pre-Synthesis Partitioner 816 partitions behavioral descriptions (VHDL code) into RTL descriptions of modules and sub-modules. During partitioning, appropriate architectural decisions are based on time/area analysis.

The off-line part of the CDE is a collection of libraries 818, which are either in SLL (Synopsis Library Language) or SDB (Synopsys Data Base) format. SLL is a dedicated language for modelling of cells or modules, and is most suitable for synthesis and timing (static) analysis. SDB (available from LSI Logic corporation) is the Design Compiler's database, and can contain a design description in a multitude of formats, including Boolean expressions, truth tables and net lists.

A Macro-Cell Model Generator 820 reads the structural description of the macro-cells from the MDE libraries and generates the appropriate models in SLL. The behavior of sequential cells may be modeled by the Model Generator, subsequently to be manipulated by the Design Compiler.

An I/O Buffer Model Generator 822 provides timing and drive capability information on the I/O buffers, which are modeled as ordinary macro-cells in the CDE environment. Data derived therefrom is used for optimization of the logic inside the chip. The Optimizer (Design Compiler 604) is not expected to manipulate the I/O buffers. This Model Generator is capable of handling configurable buffers, which are modelled as "n" cells, where "n" is the number of all the possible configurations of that buffer.

A Mega-Cell Model Generator 824 is similar to the Memory Modeler in the on-line portion of the CDE in that the objectives are generally the same. However, as mega-cells are static and do not change from one design to the other, this modelling can be performed in advance to create a synthesis mega-cell library.

Mega-Functions Support 826 provide the Design Compiler with timing information about the mega-functions. This helps the optimization process, since the drive capabilities, capacitive loads, and path delays of the mega-functions will define some constraints for the surrounding logic. Mega-functions are essentially "black boxes" from the user's point of view. Therefore, the Design Compiler is configured to prevent users from viewing or altering the mega-functions.

The various functions of the Design Compiler are shown in the block 604, and a VHDL Simulator (for behavioral and structural verification discussed hereinbefore) is shown at 828.

Illustrative tools (ChipSizer, MemComp, LCMP, LLINK, LVER, LDEL, LCAP, LSIM, LBOND and LPACE), commercially available within LSI Logic's Modular Design Environment 830 are shown. Generally, these tools consist of a set of programs that compile, link, simulate and verify digital logic at the chip (structural) level. Any number of other, commercially available programs could be employed at this level to perform similar functions.

FIG. 9

Figure 9:
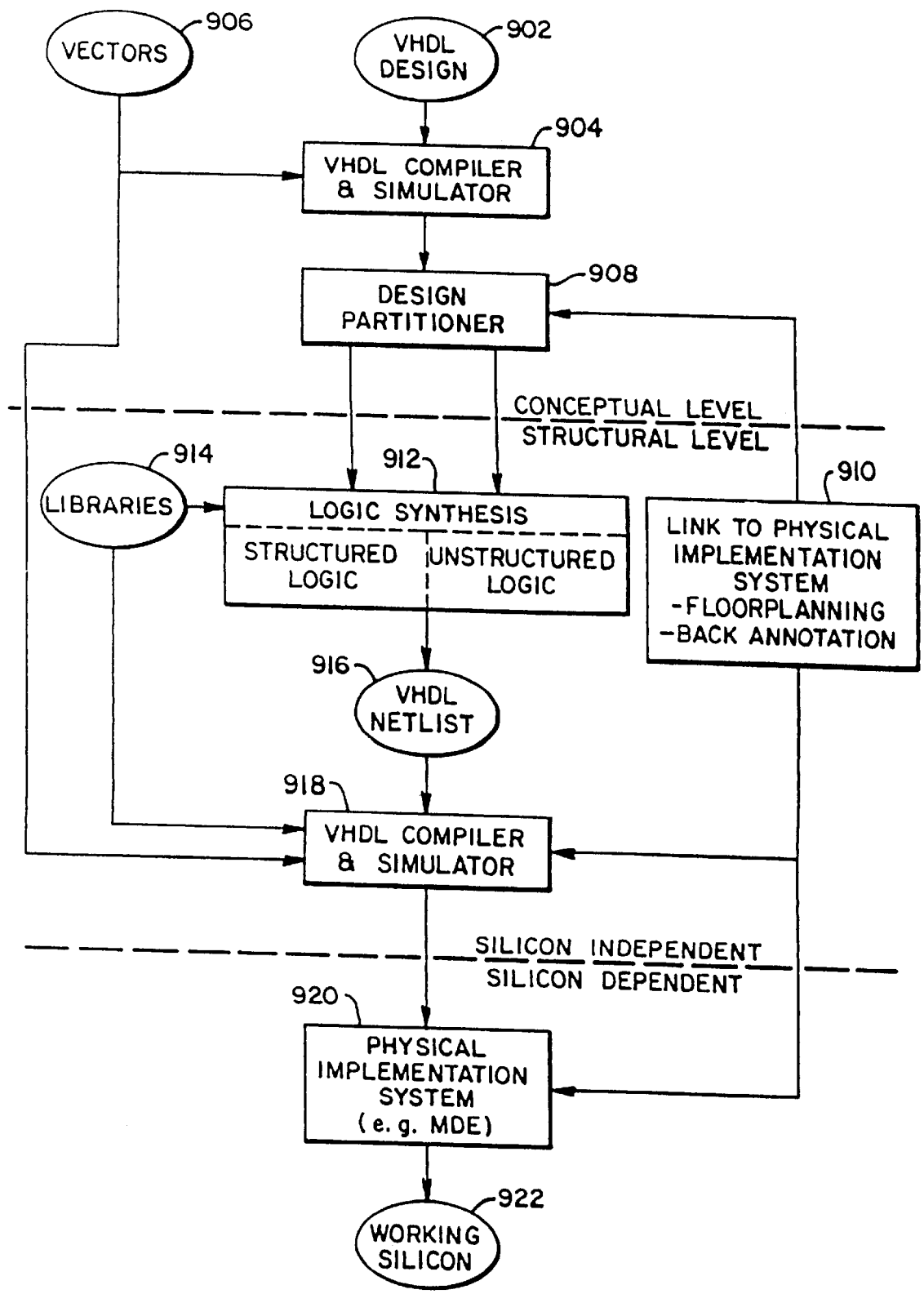
FIG. 9 is a block diagram of the methodology of the present invention.

FIG. 9 shows a more generalized arrangement of the methodology of the present invention, in such terms that one skilled in the art to which the invention most nearly pertains could readily implement the methodology.

At the conceptual level, a behavioral description 902 of the target device is formulated in a high-level language, such as VHDL. The behavioral description is compiled and simulated 904 using test vectors 906 to verify the design description. The behaviorally-verified design is partitioned 908 into suitable architectural blocks, as described above. Partitioning allows for the critical line 910 to the physical implementation of the target device, incorporating critical size (area) constraints (i.e. floor planning) and critical timing (speed) information (i.e. back annotation).

At the structural level, the partitioned design is provided to logic synthesis tools 912 which formulate both structured and unstructured logic (functional blocks). Additional information regarding the functional blocks is derived from libraries 914. Importantly, the timing/area constraints introduced through the partitioner 908 are embedded at the logic synthesis stage. The output of the logic synthesizer 912 is a net list 916 for the target device, such as in VHDL, which is compiled and re-simulated 918 (904), using the test vectors 906 and pre-defined information about blocks contained in the libraries 914. If necessary, updated timing/area constraints are provided back through the partitioner 908 and the target device is re-synthesized 912 to meet the desired goals. By iteratively repeating this process, both the behavioral and structural descriptions of the target device can be fine tuned to meet and/or modify the design criteria.

At both the conceptual (behavioral) and structural levels, the design of the target device is technology (silicon) independent.

After a valid, verified net list has been described, the structural description of the target device is provided to a suitable silicon compiler (Physical Implementation System) 920, such as LSI Logic's MDE, to create a working device 922. At this stage, the tools required are technology (silicon) dependent.

FIGS. 10–11

Figure 10:
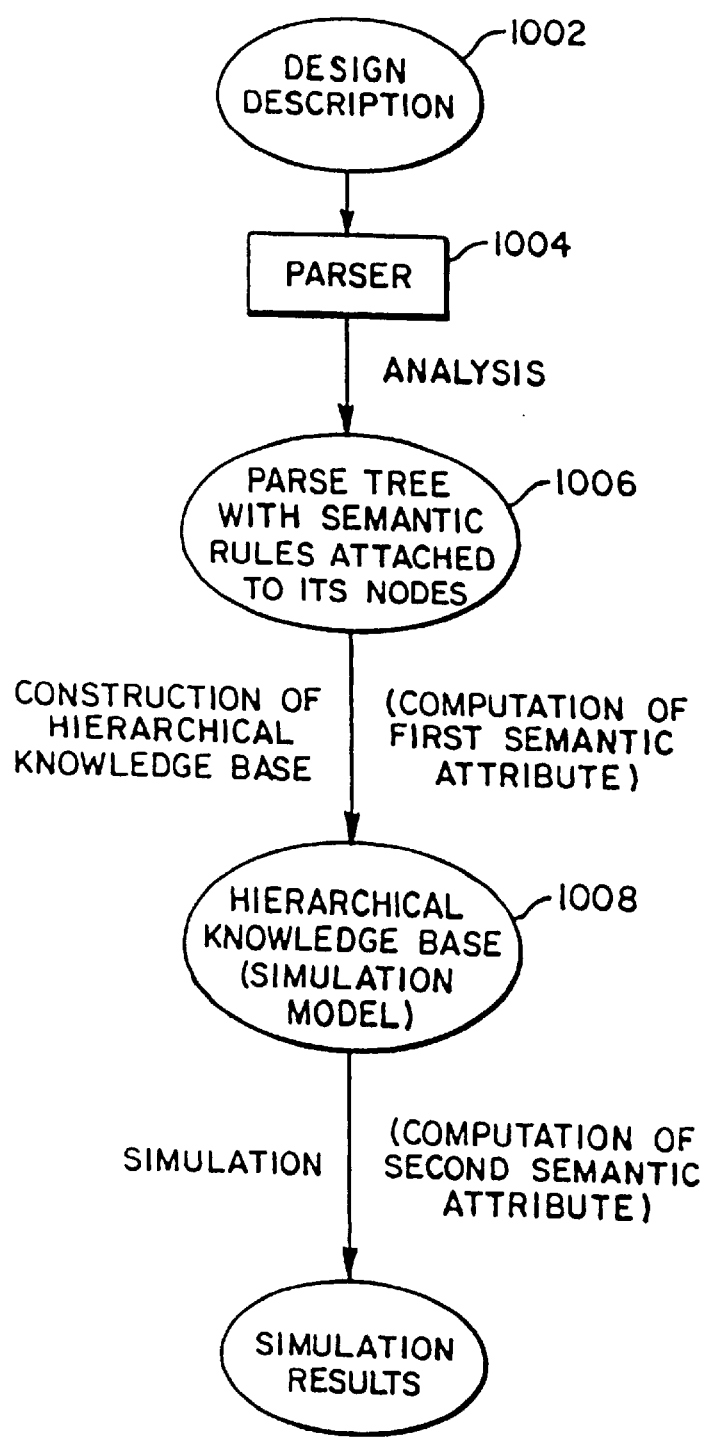
FIG. 10 is a block diagram of the Analyzer portion of the present invention.
Figure 11:
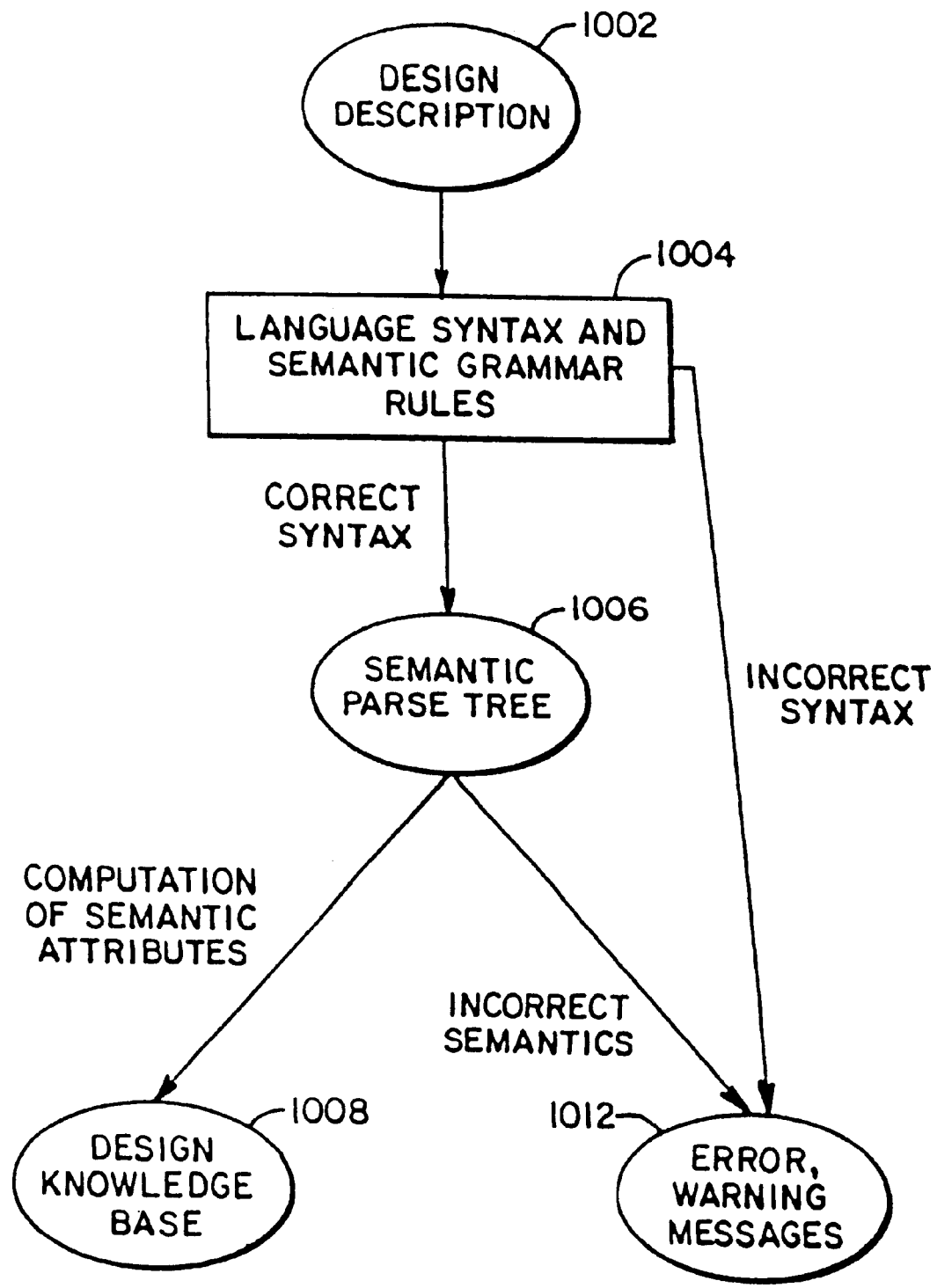
FIG. 11 is a block diagram showing the Analyzer.

FIGS. 10 and 11 illustrate a hierarchical knowledge base approach to simulate hardware descriptions in a high-level Hardware Description Language (HDL). In this approach, a knowledge base is constructed corresponding to each functional block of the hardware description. The hierarchical relationships among the various blocks in the description is mapped on to the knowledge base corresponding to those blocks. The hierarchical knowledge base thus formed is used for simulating the hardware description. Unlike previous approaches to simulation and verification of digital circuits (devices) described in a HDL, there is no need for intermediate translation steps.

In the past, artificial intelligence techniques have been used in formal verification and hybrid simulation of digital hardware to address the problem of combinatorial explosion of exhaustive logic simulation. In one approach, structural and behavioral descriptions of a design are first translated into first order clauses in Prolog. This set of clauses asserted in a Prolog data base can be viewed as a "flat" knowledge base. The hierarchy in the design is enforced implicitly by suitable relationships among the assertions in the knowledge base. A theorem prover is then used to establish the equivalence between the structural specification and the behavioral description to formally verify the design as represented by the data base. This approach has the disadvantages of translating a HDL description of a design into first order clauses and maintaining a large knowledge base which is difficult to manage for complex, hierarchical systems. In another approach, hybrid simulation is used to verify digital designs. the design is described as an interconnection of functional modules in a first order language, such as Prolog. The design may be hierarchical with the lowest level being Boolean gates. It is then simulated with both numerical and symbolic input signal values. This, again, has the drawback of having to maintain a large Prolog description for complex hierarchical designs.

The present methodology differs from the previous approaches by not having to go through intermediate translation steps, and not having to maintain a Prolog description of the design. Generally there are three steps in the present methodology:

Analysis, wherein the input description is analyzed for syntactic and semantic correctness, and a parse tree is formed. Each node in the parse tree is associated with a semantic rule.

Construction of the hierarchical knowledge base, wherein the semantic rules associated with nodes of the parse tree are used to construct a knowledge base for each block of the description, and the hierarchical relationships among the knowledge bases are derived from the semantic rules. The knowledge bases contain simple assertions and methods to compute functions and procedures present in the source description. The also make up the basis for other design tools.

Simulation, wherein using these simple assertions and computation methods contained in the knowledge bases, the output signal values are calculated for a given set of input signal values. The input stimulus can be either symbolic expressions or numerical values.

FIG. 10 shows the steps in simulating a design description.

Beginning with a design description 1002 written in a formal, high-level language, the description is analyzed (parsed) 1004 using, for instance, definite clause translation grammars (DCTG) to form a parse tree 1006. In the parse tree, semantic rules are attached to each node. Each syntactic rule for the formal (high-level) language is associated with one or more semantic rules. Preferably, two semantic rules are associated with each syntactic rule—one of the semantic rules is used to verify the semantic description of the description, and the other semantic rule is used to simulate the description. Each rule has a semantic and a syntactic part. The semantic part has two attributes namely, "check_semantics" and "execute". The semantic rules specify how these attributes are computed and verified. Using this technique, it is not necessary to go through intermediate translation steps to analyze and execute a description. Rather, the methods of analysis and execution are specified in conjunction with the syntactic rules of the language.

After a successful parse of the given description, each node in the parse tree thus formed is associated with the attributes as specified in the DCTG rules of the language. The computation of an attribute attached to a node can be a recursive transversal of sub-trees associated with the node. For semantic analysis, one semantic attribute verifies whether any semantics of the language is violated, and error messages (see FIG. 11; 1012) would be generated. These violations include redefinition of objects within the same scope and incorrect argument types to a procedure. Only a correct description is passed on to the hierarchical knowledge base 1008. Thus the analysis of the description ensures that it conforms to the syntax and semantics of the HDL description, and leads to the construction of a valid hierarchical knowledge base.

The hierarchy in a design description can be of two kinds. One is imposed by the structural design description in which a design entity (component, process, function, architecture, configuration) is composed of several other design entities. The second relates to scoping and visibility rules of the language. The knowledge base 1008 is formed, i.e. one knowledge base for each design entity, after the syntax and semantic analysis of the input HDL description. Each knowledge base has a set of unit clauses which correspond to all the static declarations, default values of signals, variables and the data structures necessary for simulation corresponding to the design entity. The hierarchical relationships among the knowledge bases are automatically derived while analyzing the design description using the DCTG rules of the HDL. This corresponds to a direct mapping of the hierarchy in the hardware design description. The need for a hierarchical knowledge base also arises due to the scope and visibility rules of a formal language that is being analyzed. The scoping and visibility rules are also used to determine the relationships among the design entity knowledge bases. The hierarchical knowledge base 1008 makes up a simulatable model of the design. Other design tools such as synthesis and partitioning tools (discussed hereinbefore) also use the knowledge bases for extracting design information.

In the past, because of the scope and visibility of the rules of a formal language, in both translation and compilation, every identifier is given a unique name. However, in the case of simulation, when the description is being executed directly, this technique is not feasible.

The description contained in the knowledge base may contain different levels of abstraction of hardware design, namely, behavioral, RTL and gate level descriptions. Simulation involves execution of all the functions, procedures and processes for generating transactions on the drivers. A driver is associated with every signal that appears in a signal assignment statement and is represented by a sequence of transactions (each transaction is a value/time pair). Generating transactions, ordering them according to certain constraints, and scheduling them at a certain time is the key to simulation. The input test vectors for simulation are asserted in the knowledge base corresponding to the design entity in which the input signal appears. The test vectors can be either symbolic expressions or numerical values. The DCTG rules are again applied to the simulation data structures stored in the knowledge bases and a second semantic attribute ("execute") is computed. This set of semantic rules constitutes the simulation engine. It includes computation of values of arithmetic expressions, Boolean expressions, symbolic expressions, time expressions, execution of sequential and concurrent statements, and generation of transactions. The computation is ordered by the simulation semantics of the language in conjunction with the hierarchical relationships. After generating transactions for all drivers, they are ordered with regard to time, synchronicity and simultaneity. As simulation time advances, the drivers update the values of the associated signals. This causes events to occur on the signals which may cause certain processes to "wake up" and in turn lead to the occurrence of more events. The next step is to schedule the events on the signals. This is handled by a scheduler which looks at the event ordering and generates unit clauses related to the time, signal and value of a scheduled event. The final step is to assign the value to the signal at the appropriate time.

It may happen that there could be multiple drivers due to multiple signal assignments in the source description. For the same signal, multiple drivers might try to assign values at the same time. In such a case, the value is resolved by a resolution function associated with the signal, and the resolved value is assigned to the signal. This leads to unit clauses which give the final resolved values of every signal present in the design description, in the simulation results 1010.

FIG. 11 is an overview of the types of rules, described above, for defining the correct relationship between objects in the constructed knowledge bases, for converging to correct structural representations of behaviorally-specified designs, and for enforcing a "good" style of VHDL code leading to the correct structural representations.

Prolog provides a useful tool for implementing the described methodology. Prolog grammars such as DCTG are useful in associating semantic rules with syntactic rules of the hardware description language (e.g. VHDL), and the inference engine contained in Prolog makes it straightforward to handle derivation of the inter-relationships between the different entities in the knowledge base.

The hierarchical knowledge base, described above, helps maintain the hierarchical nature of large hardware designs and permits large hardware descriptions to be directly simulated without having to go through intermediate translation steps. The knowledge base can be used by other tools, such as those set forth above.

An executable listing of the Analyzer/Interpreter, as described with respect to FIGS. 10 and 11, is appended to the specification of U.S. Pat. No. 5,222,030.

FIGS. 13–15

FIGS. 13 through 15 show representative screen displays of the methodology of the present invention, as they would be presented to the user. In the main, the display of FIG. 13 is discussed.

In the lower left "window" of the display of FIG. 13 is shown a VHDL description of a counter ("while x<a loop . . . "), created by the user. The user then simulates the code, at the high-level, to ensure that it the description is correct, by providing operands ("variables").

The system then creates "data flow", relating to the sequencing of operations and the parallel or serial configuration of functional blocks required to realize the counter, and presents the results to the user in graphical and/or textual form. In this example, seven design alternatives are displayed in the upper left window ("Design: [[1]. . . "). One of these design alternatives, selected by the user for viewing, is displayed in the upper right window (as interconnected circle and square primitives). In the lower right window is displayed the estimated area that would be required to implement the design, which is technology dependent. Also displayed in the upper left window are estimates of functional units (registers, muxes) that would be consumed by the various design alternatives. This all relates to exploring the design space, and allows the user to perform a "what if" analysis for choosing a preferred design in terms of size, speed, performance, technology and power. (In the upper left window of FIG. 15 are shown size estimates for particular functional blocks labelled "8.1", "11.1", etc.) All of the above is performed prior to any synthesis, to allow the user to make intelligent trade-offs leading to a viable design, by interacting at the architectural level.

By partitioning, accurate timing estimates can be derived as discussed hereinbefore (not shown in the screen displays).

Summary

A methodology is described for the implementation of complex digital systems. The methodology includes:

a) a mechanism for semantic capture of the specification and description of the digital hardware for which an implementation is desired;

b) hardware descriptions embodied in a specification language, such as VHDL (or VHDL Intermediate Format), having well standardized semantics;

c) utilization of an appropriate software language, such as Extended Definite Clause Grammar (EDCG) and Prolog, for formal capture of the semantics of b);

d) direct execution of the semantics and of the behavior of the hardware described in a) and b);

e) execution of the intent contained in the description of a) without a translation step such as with Prolog and its predicate logic formalism (knowledge representation of the digital hardware is achieved via the imbedding provided by predicate logic, semantic description of EDCG, Prolog and the VHDL language);

f) system level partitioning for creating optimized versions of hardware functional blocks for trade-off display, predicting for estimating hardware resources (sizes), speed and power, and mapping from one level of design representation to another;

g) isomorphism among various levels of partitioned hardware (across semantics, structure, behavior, logic and functions);

h) synthesis of hardware directly from semantics and intent contained in a) through f) into low level structural logic descriptions;

i) methodology for closure between the timing goals of a) through g); and j) methods for displaying knowledge in a), d), e) and f).

One skilled in the art to which the present invention most nearly pertains will readily be able to implement the invention based on the description set forth above. The above-described embodiment is set forth in terms of exemplary, well known logic synthesis tools, especially for deriving the structural representation and physical implementation from the RTL description of the device being designed. Other implementations would largely be driven by the particular technologies and logic synthesis tools that may be employed.

Appended to the specification of U.S. Pat. No. 5,222,030 are code listings of the Partitioner program (441 pages), the Synthesis Controller program ("SYN CONTROLR") which is a background program that processes the functional calls from the VHDL description of blocks (see FIG. 6) to memory blocks, mega-cells, mega-functions and other arithmetic unit functions in MDE and replaces these blocks by a component that can be simulated and merged (443 pages), and the "LIVE" (LSI Intelligent VHDL Environment) program, which is the Analyzer referred to hereinbefore (178 pages). These are all in executable code converted into hex through a standard UNIX utility.

Attention is now directed to formal, interactive specification, design, and verification of complex digital circuits and systems.

Complex System Specification

As discussed hereinabove, as the complexity of an electronic system increases, so does the difficulty of ensuring the "correctness" of the design. Modern simulation tools aid little in verifying the behavior of such a complex system design. Recent studies showing that roughly 50% of all complex digital systems designed fail to function correctly the first time contrast sharply with the relative higher success rate for smaller, self-contained circuits (e.g., ASICs). As a result, perfectly functional ASIC designs may be produced which fail to perform properly when interconnected as an electronic system, due to problems with specifying complex systems.

Figure 16:
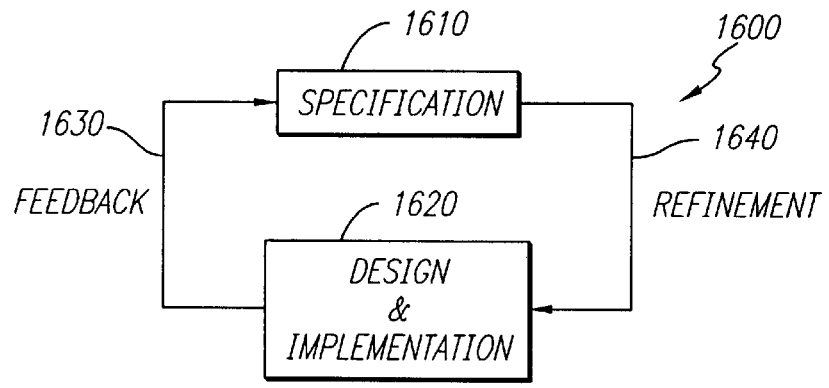
FIG. 16 is a generalized flow diagram of a typical present-day design process.

FIG. 16 is a flow diagram showing a typical design cycle 1600. In this view of the design cycle 1600, a specification 1610 completely describes an electronic system to be implemented. By the process of refinement 1640, design and implementation 1620 occurs. The design and implementation 1620 must fully and completely conform to the specification 1610. In the event that a problem is encountered during design and implementation 1620, feedback 1630 from the design and implementation stage 1620 is used to revise the specification 1610, after which refinement 1640 results in a new design and implementation 1620, etc.

In many modern design methodologies, the driving philosophy is that specification (e.g., 1610) and implementation (e.g., 1620) must be completely separate from one another. In fact, this was the prevailing view in most colleges, universities, research institutions, and industries for many years. Most modern design methodologies and procedures are based upon this driving philosophy. Unfortunately, this view of the design process is quite unrealistic. Specification and implementation are hopelessly intertwined because they represent, respectively, the finished and yet-to-be-finished portions of a multi-step development process. The multi-step nature of the development process remained largely hidden from view because until the advent of today's enormously complex systems, the multi-step process was hidden within the minds of the system designers, who followed the multi-step process instinctively, unobserved and unrecorded.

This multi-step process inevitably results in specification modifications which, despite the best efforts of "purists" who attempt to maintain separation between specification and implementation, often undergo numerous revisions. To wit, practically no modern system specification is ever released in final form with a revision label such as "Revision 1.0, Initial Release". If it is taken as a given that the system specification must accurately reflect the final implementation, then specification modifications are virtually inevitable.

Specification modifications arise primarily from two causes: physical limitations and imperfect foresight. Choices made in a system specification may mandate a specific architecture or other design choice. Such choices often involve specific technologies which have inherent physical limitations. At first glance, especially from the "lofty", almost detached viewpoint of the system specification, these choices may appear to provide a simple, cost-effective solution. However, the physical limitations of the technologies may cause unanticipated, undesirable effects such as excessive delay, limited capacity, failure to meet timing closure, etc. In the event of such problems, the specification must ultimately be revised.

Imperfect foresight is generally the result of the human inability to anticipate and think through every detail of a highly complex system. It is virtually impossible to foresee all of the implications and interactions in such systems. As a result, designers examine these interactions and implications in greater detail by creating partial implementations of the specification. In the process of generating these trial designs, the abstract concepts of the system specification become more concrete and can be examined more readily. The results of examining the partial implementations give greater insight into interactions within the system, and often result in specification revisions.

This view of intertwined specification and implementation is described and elaborated upon in *Communications of the ACM,* July, 1982, Vol. 25, No. 7, "*On the Inevitable Intertwining of Specification and Implementation*", W. Swartout and R. Balzer, and is considered to be known for purposes of the present description.

Figure 17:
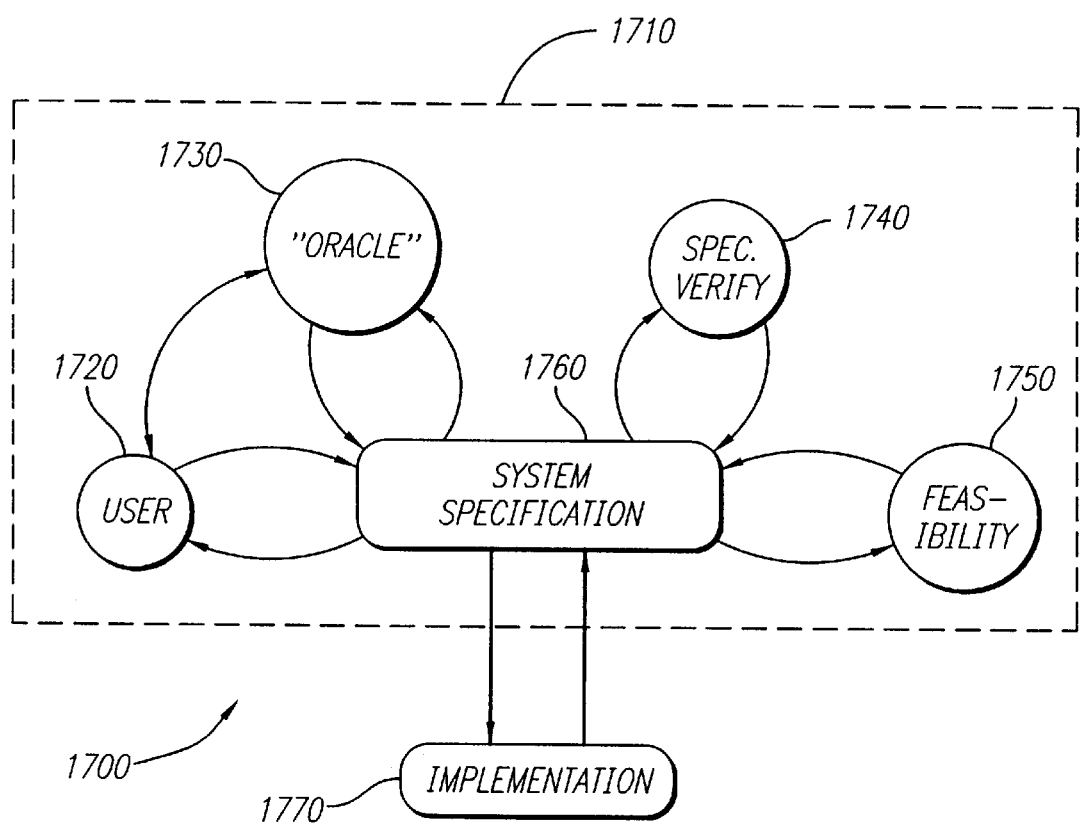
FIG. 17 is a data flow diagram showing an interactive specification generation and design process, according to the invention.

FIG. 17 is a data flow diagram showing a design cycle 1700 whereby a system specification 1760 is created using an automated, interactive, iterative specification closure process 1710 on an ECAD system. (The existence of a suitable ECAD system is assumed.) The specification closure process 1710 seeks to examine and explore interactions between elements of the system prior to specification closure and prior to significant implementation effort. Similar to the process shown and described hereinabove with respect to FIG. 16, there is a two-way refinement/feedback cycle between implementation 1770 and specification 1760. However, where the process 1600 of FIG. 16 used a "long loop" involving successive refinement of the specification 1610 by interaction with information gleaned from the process of design and implementation 1620, there are many "short loops" within the specification closure process 1710 of FIG. 17 which help to resolve many specification-related problems prior to implementation 1770.

In order to accomplish the goals of the automated specification closure process 1710, it is necessary that the specification 1760 be provided in a form which can be directly operated upon by a computer in the ECAD system. To this end, a directly-executable formal specification language is used for the specification 1760. An example of such a specification language can be found in Owre, Shankar, and Rushby, "*The PVS Specification Language (Draft)*", Computer Science Laboratory, SRI International, Mar. 1, 1993. The PVS (Prototype Verification System) Specification language provides the syntactical structure by which digital systems can be defined (specified) in a computer-executable manner. A typical formal specification written in this language consists of a collection of "theories". Each theory consists of a "signature" for the type names and constants introduced in the theory, and the axioms, definitions, and theorems associated with the signature. The PVS specification language is based upon simply-typed higher order logic.

Formal computer-executable specification language techniques are particularly well suited to the specification of complex digital systems, because there is only a finite number and type of basic operations which can be performed by combinational and sequential logic. As a result, no significant limitations are placed on the function or type of digital systems which can be specified using such formal techniques. By way of contrast, formal specification of analog systems in the general case would be considerably more difficult using such techniques, since the scope of the analog "domain" is relatively open-ended.

In the specification closure process 1710, a user 1720 on an ECAD system interactively generates the system level specification 1760 for a complex digital system. An expert system, or "Oracle" 1730, monitors the content of the specification and can be consulted by the user 1720 during specification entry. (Expert systems are well known to those of ordinary skill in the art and have been widely implemented and published. As such, they will not be further elaborated upon herein.) The "Oracle" 1730 is trained in the details of the specification language and relationships between specification elements, Accordingly, the "Oracle"

1730 can identify relational properties between elements of the complex digital system (as represented by the specification 1760). The user 1720 can query the oracle about interactions and relationships (e.g., communication protocols) between elements of the specification 1760 (representing corresponding portions of the digital system) and to obtain suggestions on how to obtain specific system behavior, information about situations to avoid, and how to eliminate undesired interactions.

A specification verification process 1740 examines the specification for logical consistency, completeness, and syntactical correctness, as shown in FIG. 19. Should any inconsistencies, syntax errors, or omissions occur within the specification 1760, the specification verification process provides the user 1720 with information about the location (in the specification) and cause of the problem.

A feasibility analysis process 1750, combines several different formal design validation techniques. A first of these techniques is "model checking". Model checking is a technique by which complex digital systems having extremely large numbers of states can be verified without actually having to reach all of the possible states in the system. This is accomplished by using binary decision diagram (BDD) representations of the logic in the digital system to search out and exploit any regularity in the state space of the digital system. Model checking is described in J. R. Burch, E. M. Clarke, K. L. McMillan, and D. L. Dill, "Sequential Circuit Verification using Symbolic Model Checking", Proceedings of the 27$^{th}$ Design Automation Conference, pp. 46–51, Orlando, Fla., Jun. 24–28, 1990 and K. L. McMillan and J. C. Schwalbe, "Formal Verification of the Gigamax Cache Consistency Protocol", Technical Report, Carnegie Mellon University, Jun. 20, 1991.

A second of the formal design validation techniques is Mathematical Theorem Proving, whereby mathematic techniques are used to provide formal proof of the "theorems" in the specification 1760. A suitable formal theorem-prover is described in N. Shankar, S. Owre, and J. M. Rushby, "The PVS Proof Checker: A Reference Manual", Draft, Computer Science Laboratory, SRI International, Menlo Park, Calif., February, 1993.

Another suitable theorem-proving technique based upon higher-order logic is described in A. Camillari, M. Gordon, and T. Melham, "Hardware Verification using Higher-Order Logic", published in the Proceedings of the International Federation For Information Processing International Working Conference: From HDL Descriptions to Guaranteed Correct Circuit Designs, Grenoble, France, Sep. 9–11, 1986. The attraction of higher-order logic for mathematical theorem proving is that it can represent sequential behavior, and higher-level data types, such as integers, whereas Boolean algebra cannot. The greater expressive power of higher-order logic is utilized to great advantage in constructing formal proofs. (Theorem proving, in general, is known to those of ordinary skill in the art.)

A third of the formal verification techniques is "symbolic simulation". Symbolic simulation can be viewed as an extension of ordinary switch-level simulation where node values may be treated symbolically, i.e., variables may be used to represent node values instead of constants such as "T" and "F". A symbolic simulator can be used to verify assertions about the state of a logic circuit that results from a given sequence of inputs, e.g., to show that the value of a particular output node is accurately described by a mathematical or logical function of a set of variables representing input values. Recently, symbolic simulation has been extended with "symbolic trajectory evaluation". Whereas symbolic simulation deals well with single states, symbolic trajectory evaluation makes possible accurate analysis and rigorous evaluation of temporal relationships between node values. By using symbolic trajectory evaluation in conjunction with symbolic simulation, a powerful technique is provided for verifying assertions about node values in multi-state systems.

By further extending the symbolic simulation and symbolic trajectory analysis with a set of general purpose reasoning tools, a hardware verification tool results which is capable of combining results of separate symbolic trajectory evaluations to yield verification results which would exceed the capacity of symbolic trajectory evaluation alone. Further, the verification results obtained by the extensions to symbolic trajectory evaluation can be formally related to higher levels of abstraction, including the formal specification of mixed software/hardware systems.

An extended symbolic simulation technique of this type (i.e., symbolic simulation+symbolic trajectory evaluation+ general purpose reasoning tools) is described in J. J. Joyce and C. Seger, "Linking BDD-Based Symbolic Evaluation to Interactive Theorem Proving", Proceedings of the 30$^{th}$ Design Automation Conference, pp. 469–474, Dallas Tex., Jun. 14–18, 1993.

Figure 18:
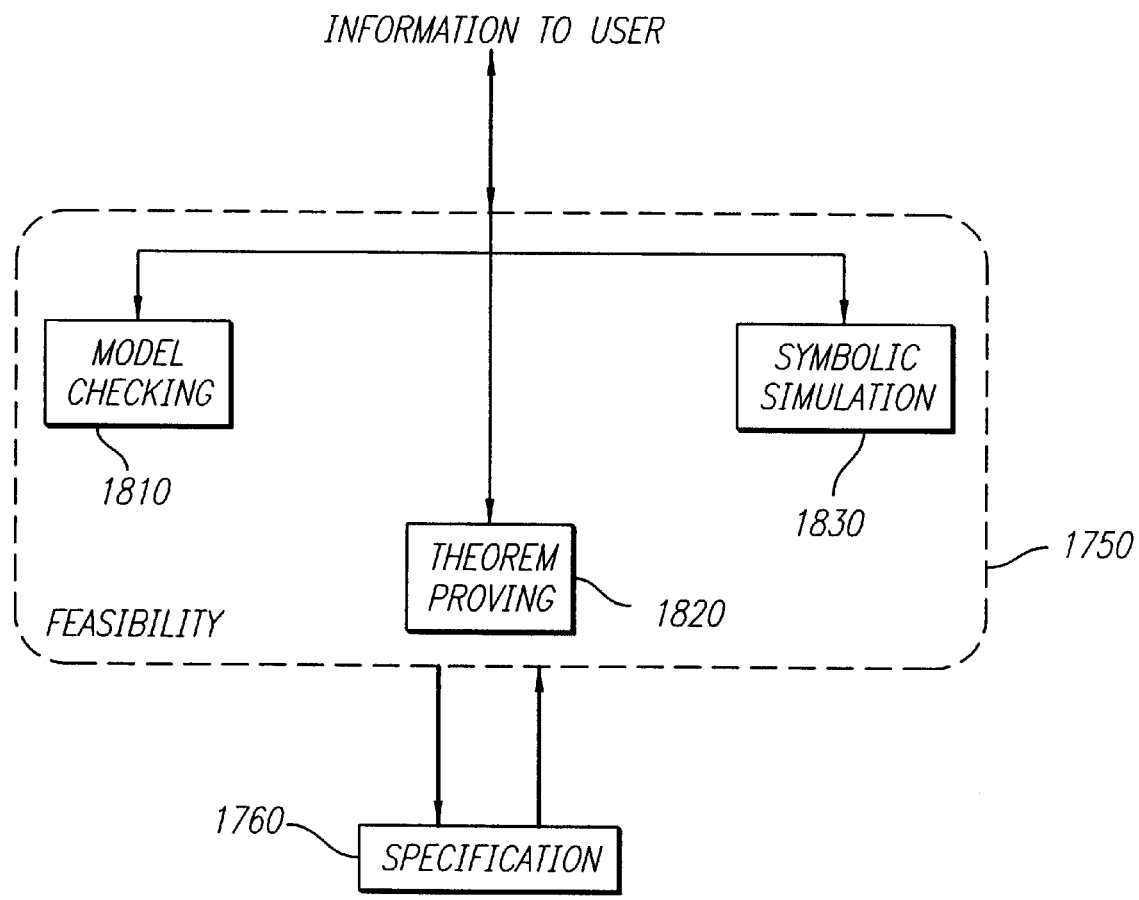
FIG. 18 is a generalized flow diagram of the technique of the present invention, illustrating an expansion of the feasibility analysis shown in FIG. 17.

FIG. 18 illustrates the expansion of Feasibility analysis block 1750. The feasibility block 1750 comprises a model checking function 1810, a theorem proving function 1820, and a symbolic simulation function 1830 (extended, as described hereinabove). Any or all of these functions can be activated by the user to verify the correctness of the specification 1760. Information related to the verification of the specification 1760 is passed back to the user 1720 so that the user can modify the system design (via the specification 1760), as required.

One of ordinary skill in the art will immediately recognize that since the aforementioned extended symbolic simulation technique (1830) can be used to bridge the gap between a lower level implementation and its higher level specification, that this technique 1830 can be used to ensure that specification implementations conform adequately to the specification and to ensure that any specification has a viable, feasible solution.

By entering the specification in the above-described interactive, iterative process, an environment is created which acts as a sounding board for the system designer to evaluate system concepts during the specification process. As the concepts evolve, so evolves the specification. Once a satisfactory concept is reached, it is guaranteed (by formal verification) that a realizable implementation of the specification exists. This greatly increases the probability of a successful implementation with a minimum number of iterations and specification changes.

By validating and verifying concepts at the same time as producing a formal specification for a complex digital system, many of the oversights and ambiguities often found in natural-language specifications are eliminated. Further, the system designer (user) is given much greater insight into the behavior of the system and can explore aspects of system performance in great detail which he would otherwise only be able to guess at. Under ordinary circumstances (i.e., without the inventive automated, interactive, iterative specification generation process), the system designer would have to rely on the results of further design and implementation (specification refinement) to gain similar insight into the details of system behavior. The perils and costs of that approach have been discussed hereinabove.

The process of iteratively, interactively generating a formal specification for a complex digital system can be summarized, as follows:

creating a formal specification for the complex digital system using a formal, directly-executable specification language; and iteratively performing the steps of:
a) checking for syntactical correctness of the formal specification;
b) checking for logical consistency of the formal specification;
c) checking for completeness of the formal specification;
d) checking for correctness of the formal specification;
e) comparing the desired behavior with the behavior described by the formal specification;
determining the existence of at least one realizable implementation of the formal specification; and
g) correcting any problems detected in steps a)–f) above by revising the formal specification;

until the formal specification is syntactically correct, logically consistent, correct and complete, reflects the desired behavior, and has at least one realizable implementation.

The foregoing discussion has been directed to using formal verification techniques for the interactive, iterative entry of a fully-validated, computer-executable specification into an ECAD system. The result is a complete behavioral description of a complex digital system which is known to have at least one realizable implementation. Another discussion hereinabove was directed to synthesizing a chip or system design from a behavioral description thereof. Attention is now directed to applying the formal verification techniques to the system design process (specification refinement) in order to ensure compliance between specification and implementation at every level of abstraction.

System Design

One of ordinary skill in the art will readily appreciate that the formal verification techniques described hereinabove can be applied at practically any level of abstraction. However, in ordinary design cycles, one typically simulates only the behavior of the particular subsystem being designed. If minor modifications or enhancements are made to automatically-generated subsystems by a user of an automated design system, the modified subsystem is usually verified in isolation. Any possible impact of the subsystem modification on the overall system may be overlooked.

In general, the design/implementation process may be viewed as the refinement (iterative design/revision cycles) of the specification. At each stage in the design process, a specification is transformed into an implementation. For example, a design could progress from a specification level to an architectural level, behavioral level, register-transfer level, gate level, switch level, polygon (layout) level, and eventually into a physical implementation (e.g., silicon integrated circuit or system of integrated circuits). An implementation from each stage (level) provides the specification for a subsequent implementation at a subsequent stage (level). Introducing formal verification techniques between key stages in the design process helps to increase the level of confidence in the resulting design and improves the chances of obtaining a "correct" implementation.

At each stage of design, an automated synthesis process is used to generate (synthesize) an implementation according to the "specification" at the immediate previous higher level. Using the techniques described hereinabove with respect to FIGS. 1–15, the primary goal was timing closure.

In addition to the timing goals, the goal of specification closure can be added, i.e., that any system implementation at any level must be verified to be in compliance with its own specification and with the system specification. This is accomplished by applying the aforementioned formal verification techniques to ensure that the behavior of the implementation of the system specification reflects a subset of the system behavior described by the system specification.

The above, and other objects, features, advantages and embodiments of the invention, including other (i.e., additional) embodiments of the techniques discussed above may become apparent to one having ordinary skill in the art to which this invention most nearly pertains, and such other and additional embodiments are deemed to be within the spirit and scope of the present invention.

What is claimed is:

1. In a method for fabricating an integrated circuit chip, an iterative, interactive method of generating a formal, directly-executable specification for a complex digital system, comprising:

establishing a desired behavior for a complex digital system;

creating a formal specification for the complex digital system using a formal, directly-executable specification language; and iteratively performing the steps of:
(a) examining for syntactical correctness of the formal specification;
(b) examining for logical consistency of the formal specification;
(c) examining for completeness of the formal specification;
(d) checking for correctness of the formal specification;
(e) comparing the desired behavior with the behavior described by the formal specification;
(f) determining the existence of at least one realizable implementation of the formal specification; and
(g) correcting any problems detected in steps (a)–(f) above by revising the formal specification;

until the formal specification is syntactically correct, logically consistent, correct and complete, reflects the desired behavior, and has at least one realizable implementation.

2. A method according to claim 1, further comprising:

verifying correctness of the formal specification;

verifying completeness of the formal specification; and verifying the existence of at least one realizable implementation of the formal specification.

3. A method according to claim 2, wherein:

the steps of verifying completeness, verifying correctness, and verifying existence of a realizable implementation are accomplished using formal proof techniques.

4. A method according to claim 3, wherein:

the formal proof techniques are selected from the group consisting of symbolic simulation, mathematical theorem proving, and model checking.

5. A programmed digital computer for designing an integrated circuit chip, comprising:

memory means for storing a program including instructions and data; and processing means for executing the program;

the processing means, memory means and program operating in combination for performing the steps of generating a formal, directly-executable specification for a complex digital system, comprising:

establishing a desired behavior for a complex digital system;

creating a formal specification for the complex digital system using a formal, directly-executable specification language; and iteratively performing the steps of:
(a) examining for syntactical correctness of the formal specification;
(b) examining for logical consistency of the formal specification;
(c) examining for completeness of the formal specification;
(d) examining for correctness of the formal specification;
(e) comparing the desired behavior with the behavior described by the formal specification;
(f) determining the existence of at least one realizable implementation of the formal specification; and
(g) correcting any problems detected in steps (a)–(f) above by revising the formal specification;

until the formal specification is syntactically correct, logically consistent, correct and complete, reflects the desired behavior, and has at least one realizable implementation.

6. A programmed digital computer according to claim 5, in which the processing means, memory means and program further operate in combination to perform the steps of:
verifying correctness of the formal specification;
verifying completeness of the formal specification; and
verifying the existence of at least one realizable implementation of the formal specification.

7. A programmed digital computer according to claim 6, wherein:
the steps of verifying completeness, verifying correctness, and verifying existence of a realizable implementation are accomplished using formal proof techniques.

8. A programmed digital computer according to claim 7, wherein:
the formal proof techniques are selected from the group consisting of symbolic simulation, mathematical theorem proving, and model checking.

9. A digital storage media having a digital program stored thereon for performing an iterative, interactive method of generating a formal, directly-executable specification for a complex digital system, the method comprising the steps of:
establishing a desired behavior for a complex digital system;
creating a formal specification for the complex digital system using a formal, directly-executable specification language; and
iteratively performing the steps of:
(a) examining for syntactical correctness of the formal specification;
(b) examining for logical consistency of the formal specification;
(c) examining for completeness of the formal specification;
(d) examining for correctness of the formal specification;
(e) comparing the desired behavior with the behavior described by the formal specification;
(f) determining the existence of at least one realizable implementation of the formal specification; and
(g) correcting any problems detected in steps (a)–(f) above by revising the formal specification;

until the formal specification is syntactically correct, logically consistent, correct and complete, reflects the desired behavior, and has at least one realizable implementation.

10. A digital storage media according to claim 9, further in which the method further comprises:
verifying correctness of the formal specification;
verifying completeness of the formal specification; and
verifying the existence of at least one realizable implementation of the formal specification.

11. A digital storage media according to claim 10, wherein:
the steps of verifying completeness, verifying correctness, and verifying existence of a realizable implementation are accomplished using formal proof techniques.

12. A digital storage media according to claim 11, wherein:
the formal proof techniques are selected from the group consisting of symbolic simulation, mathematical theorem proving, and model checking.

13. A digital computer memory having a digital program stored thereon for performing an iterative, interactive method of generating a formal, directly-executable specification for a complex digital system, the method comprising the steps of:
establishing a desired behavior for a complex digital system;
creating a formal specification for the complex digital system using a formal, directly-executable specification language; and
iteratively performing the steps of:
(a) examining for syntactical correctness of the formal specification;
(b) examining for logical consistency of the formal specification;
(c) examining for completeness of the formal specification;
(d) examining for correctness of the formal specification;
(e) comparing the desired behavior with the behavior described by the formal specification;
(f) determining the existence of at least one realizable implementation of the formal specification; and
(g) correcting any problems detected in steps (a)–(f) above by revising the formal specification;

until the formal specification is syntactically correct, logically consistent, correct and complete, reflects the desired behavior, and has at least one realizable implementation.

14. A digital computer memory according to claim 13, further in which the method further comprises:
verifying correctness of the formal specification;
verifying completeness of the formal specification; and
verifying the existence of at least one realizable implementation of the formal specification.

15. A digital computer memory according to claim 14, wherein:
the steps of verifying completeness, verifying correctness, and verifying existence of a realizable implementation are accomplished using formal proof techniques.

16. A digital computer memory according to claim 15, wherein:
the formal proof techniques are selected from the group consisting of symbolic simulation, mathematical theorem proving, and model checking.

17. An apparatus for fabricating an integrated circuit chip, including structure for performing an iterative, interactive method of generating a formal, directly-executable specification for a complex digital system, said structure comprising:

means for establishing a desired behavior for a complex digital system;

means for creating a formal specification for the complex digital system using a formal, directly-executable specification language; and means for iteratively performing the steps of:
(a) examining for syntactical correctness of the formal specification;
(b) examining for logical consistency of the formal specification;
(c) examining for correctness of the formal specification;
(d) examining for correctness of the formal specification;
(e) comparing the desired behavior with the behavior described by the formal specification;
(f) determining the existence of at least one realizable implementation of the formal specification; and
(g) correcting any problems detected in steps (a)–(f) above by revising the formal specification;

until the formal specification is syntactically correct, logically consistent, correct and complete, reflects the desired behavior, and has at least one realizable implementation.

18. An apparatus according to claim 17, further comprising:

means for verifying correctness of the formal specification;

means for verifying completeness of the formal specification; and means for verifying the existence of at least one realizable implementation of the formal specification.

19. An apparatus according to claim 18, wherein:

the steps of verifying completeness, verifying correctness, and verifying existence of a realizable implementation are accomplished using formal proof techniques.

20. An apparatus according to claim 19, wherein:

the formal proof techniques are selected from the group consisting of symbolic simulation, mathematical theorem proving, and model checking.

* * * * *